(12) United States Patent
Azuma et al.

(10) Patent No.: US 7,525,627 B2
(45) Date of Patent: Apr. 28, 2009

(54) DISPLAY DEVICE

(75) Inventors: Yuji Azuma, Mobara (JP); Masaki Tsubokura, Mobara (JP); Shunsuke Morishita, Mobara (JP); Shimon Itakura, Mobara (JP); Seigo Abo, Hitachi (JP)

(73) Assignees: Hitachi Displays, Ltd., Mobara-shi (JP); Hitachi Display Devices, Ltd., Mobara-shi (JP)

( * ) Notice: Subject to any disclaimer, the term of this patent is extended or adjusted under 35 U.S.C. 154(b) by 153 days.

(21) Appl. No.: 11/749,198

(22) Filed: May 16, 2007

(65) Prior Publication Data

US 2007/0268444 A1 Nov. 22, 2007

(30) Foreign Application Priority Data

May 19, 2006 (JP) .............................. 2006-139723

(51) Int. Cl.
*G02F 1/1345* (2006.01)
(52) U.S. Cl. ....................................... 349/150; 349/149

(58) Field of Classification Search .......... 349/149–150
See application file for complete search history.

(56) References Cited

U.S. PATENT DOCUMENTS 6,342,932 B1 * 1/2002 Terao et al. .................... 349/58

* cited by examiner

*Primary Examiner*—David Nelms
*Assistant Examiner*—Phu Vu
(74) *Attorney, Agent, or Firm*—Antonelli, Terry, Stout & Kraus, LLP.

(57) ABSTRACT

A display device includes a display panel, a lower frame arranged in the rear of the display panel when viewed from a viewer, and at least one printed circuit board arranged on or above a flat plane of the lower frame. In this display device, the lower frame carries plural positioning projections. They are located outside of a region, where the printed circuit board is arranged, at positions facing each other with the interposition of the region, and arise from the flat plane of the lower frame toward the printed circuit board. Distal portions of the positioning projections protrude from, and bend away from the printed circuit board arranged on or above the lower frame.

19 Claims, 18 Drawing Sheets

DISPLAY DEVICE

CLAIM OF PRIORITY

The present application claims priority from Japanese Application JP 2006-139723 filed on May 19, 2006, the content of which is hereby incorporated by reference into this application.

BACKGROUND OF THE INVENTION (1) Field of the Invention

The present invention relates to display devices, and specifically it relates to a technique effective to be adopted to display devices which integrally hold components such as a display panel using a frame member.

(2) Description of the Related Art

Display devices for displaying pictures and images (videos) include liquid crystal display devices using liquid crystal panels. The liquid crystal display panels are display panels each including a first substrate known as a TFT substrate, a second substrate known as a counter substrate, and a liquid crystal material (liquid crystal layer) encapsulated between the first and second substrates.

The liquid crystal display devices each further include, for example, a printed circuit board for inputting picture data signals to picture signal lines of the liquid crystal display panel (TFT substrate), a printed circuit board for inputting scanning signals to scanning signal lines of the liquid crystal display panel (TFT substrate), and a printed circuit board which is generally known as TCON (timing controller) substrate and serve to input control signals to each of the two printed circuit boards, in addition to the liquid crystal display panel. When the liquid crystal display devices are transmissive or semi-transmissive liquid crystal display devices, they each have a light source (backlight) in the rear of the liquid crystal display panel when viewed from a viewer.

In the liquid crystal display devices, respective components such as the liquid crystal display panel, plural printed circuit boards, and a backlight are integrally held by a frame member. The frame member includes, for example, a first frame member and a second frame member. The first frame member is arranged in the rear of the liquid crystal display panel and/or the light source when viewed from a viewer and generally known as a lower frame. The second frame member is arranged in front of the liquid crystal display panel when viewed from a viewer and is generally known as an upper frame.

In the liquid crystal display devices, the lower frame and the upper frame integrally hold the liquid crystal display panel and the light source therebetween. In addition, a supporting member typically made of a resinous molded article is circularly arranged on the outer periphery of the liquid crystal display panel when viewed from a viewer. The upper frame and the supporting member support the liquid crystal display panel by holding the outer periphery of the liquid crystal display panel between them. The lower frame and the supporting member hold the light source and an optical sheet such as a diffuser panel between them. Such an optical sheet is arranged between the liquid crystal display panel and the light source.

The printed circuit board for inputting picture data signals to picture signal lines of the liquid crystal display panel (TFT substrate) includes, for example, plural flexible printed circuit boards, and a rigid printed circuit board for inputting signals such as control signals to the plural flexible printed circuit boards. The flexible printed circuit boards carry driver integrated circuits thereon for generating picture data signals to be inputted into respective picture signal lines. The rigid printed circuit board is mounted to and held by an outer peripheral side of the lower frame or the supporting member.

The printed circuit board for inputting scanning signals to scanning signal lines of the liquid crystal display panel (TFT substrate) includes, for example, plural flexible printed circuit boards, and a rigid printed circuit board for inputting signals such as control signals to the plural flexible printed circuit boards. The flexible printed circuit boards carry driver integrated circuits thereon for generating scanning signals to be inputted into respective scanning signal lines. The rigid printed circuit board herein is also mounted to and held by an outer peripheral side of the lower frame or the supporting member.

The printed circuit board for inputting scanning signals may include the flexible printed circuit boards alone in some recent liquid crystal display devices. In this case, signals such as control signals are inputted into the flexible printed circuit boards, for example, from the printed circuit board for inputting picture data signals through interconnections arranged on the liquid crystal display panel (TFT substrate).

The printed circuit board known as TCON substrate is arranged in the rear of the lower frame when viewed from a viewer and mounted to and held by the bottom face of the lower frame. Interconnections of the TCON substrate are connected with interconnections of the rigid printed circuit board for inputting picture data signals into picture signal lines of the liquid crystal display panel (TFT substrate) typically through flexible print cables (FPCs).

A liquid crystal display device having this configuration is assembled, for example, in the following manner. Initially, components such as a reflector, a light source, and a diffuser are arranged on the lower frame, and the supporting member is then screwed to the lower frame. Next, the liquid crystal display panel bearing, for example, the flexible printed circuit boards and the rigid printed circuit board is arranged on the supporting member, and the rigid printed circuit board is mounted to an outer peripheral side of the supporting member. Interconnections of the rigid printed circuit board mounted to the outer peripheral side of the supporting member are connected through flexible print cables. Next, the upper frame is placed on the liquid crystal display panel, and the upper frame is screwed with the supporting member, or the upper frame is screwed with the lower frame, for example. Finally, the TCON substrate is mounted to the bottom of the lower frame, and, for example, a covering member for protecting the TCON substrate is mounted to the lower frame.

SUMMARY OF THE INVENTION

Liquid crystal display devices having the above-mentioned configuration have been frequently manually assembled. When they are manually assembled, misregistration of respective components may occur, or incomplete screwing may occur. Such manual assembly may often causes damage of components such as printed circuit boards by mistake. In addition, some of steps for assembling a liquid crystal display device are poor in operation efficiency when carried out manually.

Recently, automatic assembly of such liquid crystal display devices using an assembly machine has been increasingly employed.

However, the present inventors found that automatic assembly of the liquid crystal display devices often causes imperfect mounting (imperfect assembly) in a step of mounting the TCON substrate to the lower frame. One of such problems in the known assembly technique will be illustrated with reference to FIGS. 25 and 26.

FIG. 25 is a schematic sectional view illustrating the position of an upper frame of a known liquid crystal display device to which a TCON substrate is mounted, and FIG. 26 is a schematic diagram explaining one of problems in the configuration of FIG. 25.

The known liquid crystal display device includes positioning liftings 2F at the bottom of a lower frame 2 at a position to which a TCON substrate 9 is mounted, as illustrated in FIG. 25. The liftings 2F are formed by punching a region on which the TCON substrate 9 is mounted with a blanking die, and bending the punched edges toward the TCON substrate 9 to be mounted.

However, the distance between the distal ends of the liftings 2F may be smaller than the width of the TCON substrate 9 (FIG. 26), because of insufficient bending (plastic deformation) of the liftings 2F or of external force applied to the liftings 2F after bending. In this case, the TCON substrate 9 is not mounted to the lower frame 2 as it is, and the liftings 2F must be, for example, bent again manually, and this causes poor workability. When the liquid crystal display device is manually assembled, the TCON substrate 9 may be mounted to the lower frame 2 without perceiving that the liftings 2F do not sufficiently stand, and the TCON substrate 9 may thereby be broken or damaged.

When the liquid crystal display device is automatically assembled using an assembly machine, it is also difficult to mount the TCON substrate 9 to the lower frame 2 when the distance between edges of the liftings 2F is smaller than the width of the TCON substrate 9 (FIG. 26).

In addition, it takes a long time to position (register) the TCON substrate 9 upon automatic assembly. This is because, if there is misregistration in the relative position between the TCON substrate 9 and the liftings 2F, the TCON substrate 9 may possibly come in contact with the liftings 2F and thereby be damaged upon mounting of the TCON substrate 9 to the lower frame 2, even when the liftings 2F of the lower frame 2 have normal dimensions as shown in FIG. 25.

Positioning of threaded holes for screwing the supporting member and the upper frame is also required in the assembly of the liquid crystal display device. For this purpose, the supporting member is provided with positioning projections, and the upper frame is provided with positioning holes. The present inventors found that, when the liquid crystal display device is, for example, automatically assembled using an assembly machine and using the known configuration (dimensions) for positioning, the positioning projections of the supporting member may not be inserted into the positioning holes of the upper frame due to misregistration, to fail to position the threaded holes in many cases.

Such a liquid crystal display device having the configuration is generally provided as housed in a cabinet. Accordingly, positioning between the liquid crystal display device and the cabinet is required when the liquid crystal display device is housed into the cabinet. The positioning, however, is difficult according to a known manual assembly or automatic assembly technique.

Accordingly, it is desirable to provide a technique capable of improving the workability in a step of mounting a printed circuit board to a lower frame in assembly typically of a liquid crystal display device.

It is also desirable to provide a technique capable of easily carrying out positioning between a supporting member and an upper frame in assembly typically of a liquid crystal display device.

In addition, it is desirable to provide a technique of reducing imperfect assembly of components due to misregistration in assembly typically of a liquid crystal display device.

These and other desirable embodiments and advantages of the present invention will be illustrated below with reference to the attached drawings.

Some representative embodiments according to the present invention will be schematically illustrated below.

According to an embodiment of the present invention, there is provided (1) a display device which includes a display panel; a lower frame arranged in the rear of the display panel when viewed from a viewer; and a printed circuit board arranged on or above a flat plane of the lower frame, in which the lower frame has plural positioning projections, which positioning projections are located outside of a region where the printed circuit board is arranged at plural positions facing each other with the interposition of the region, and arise from the flat plane of the lower frame toward the printed circuit board, and distal portions of the positioning projections protrude from, and bend away from the printed circuit board arranged on or above the lower frame.

(2) The lower frame in the display device according to (1) may have protrusions for fixing the printed circuit board, which protrusions are arranged inside of the region where the printed circuit board is arranged, and bend so as to support and fix the printed circuit board.

(3) In the display device according to (1), the printed circuit board may have positioning grooves at least in the vicinities of center parts of parallel two sides, which positioning grooves are concave toward the center of the printed circuit board, and the positioning projections of the lower frame may engage with the positioning grooves of the printed circuit board so as to support and fix the printed circuit board.

(4) In the display device according to (1), the printed circuit board may have a substantially quadrilateral planar shape, and the positioning projections of the lower frame may be arranged at positions corresponding to the four sides of the printed circuit board.

(5) In the display device according to (1), the printed circuit board may be arranged in the rear of the lower frame when viewed from a viewer.

(6) The display panel in the display device according to (1) may be a liquid crystal display panel which includes a pair of substrates, and a liquid crystal material encapsulated between the pair of substrates.

(7) According to another embodiment of the present invention, there is provided a display device which includes a display panel; a supporting member arranged on an outer periphery of the display panel when viewed from a viewer; and an upper frame arranged in front of the display panel when viewed from the viewer, which supporting member and the upper frame support the display panel by holding the outer periphery of the display panel between them. In this display device, the supporting member carries at least one positioning projection arranged on a plane facing the upper frame and protruding toward the upper frame, the upper frame has at least one positioning opening corresponding to the at least one positioning projection of the supporting member, and the opening edge of the upper frame around the positioning opening has an inner periphery and an outer periphery, the outer periphery extending toward the supporting member, and the inner periphery located in the vicinity of the opening edge and extending away from the supporting member.

(8) In the display device according to (7), a surface of the inner periphery facing the positioning projection of the supporting member may be curved.

(9) The at least one positioning opening of the upper frame may be located in the vicinity of the bottom of the at least one positioning projection of the supporting member in the display device according to (7).

(10) In the display device according to (7), the outer periphery of the opening edge may extend toward the supporting member longer than the inner periphery of the opening edge extends away from the supporting member.

(11) The display panel in the display device according to (7) may be a liquid crystal display panel including a pair of substrates, and a liquid crystal material encapsulated between the pair of substrates.

(12) According to yet another embodiment of the present invention, there is provided a display device which includes a display module including a display panel and a lower frame arranged in the rear of the display panel when viewed from a viewer; and a cabinet housing the display module, in which the cabinet has plural positioning projections, which positioning projections are located in the rear of the lower frame when viewed from the viewer, are arranged on a plane facing the lower frame, and protrude toward the lower frame, the lower frame has positioning openings corresponding to the positioning projections of the cabinet, and the vicinities of opening edges of the peripheries around the positioning openings of the lower frame bend and extend away from a plane facing the cabinet, and surfaces of the bending vicinities facing the positioning openings of the cabinet are curved.

(13) In the display device according to (12), the bottoms of the positioning projections of the cabinet may have planar areas larger than the opening areas of the corresponding positioning openings of the lower frame.

(14) According to still another embodiment of the present invention, there is provided a display device which includes a display module including a display panel and a lower frame arranged in the rear of the display panel when viewed from a viewer; and a cabinet housing the display module, in which the cabinet is located in the rear of the lower frame when viewed from the viewer and has at least one positioning opening in a plane facing the lower frame, the lower frame carries at least one positioning projection corresponding to the at least one positioning opening of the cabinet, and the opening edge of the cabinet around the positioning opening has an inner periphery and an outer periphery, the outer periphery bends and extends toward the lower frame, and inner periphery is located in the vicinity of the opening edge and bends and extends away from the lower frame.

(15) In the display device according to (14), a surface of the inner periphery facing the positioning projection of the lower frame may be curved.

(16) In the display device according to (14), the at least one positioning opening of the cabinet may be located in the vicinity of the bottom of the at least one positioning projection of the lower frame.

(17) In the display device according to (14), the outer periphery of the positioning opening of the cabinet may extend toward the lower frame longer than the inner periphery of the opening edge extends away from the lower frame.

(18) In the display device according to one of (12) and (14), the display panel may be a liquid crystal display panel including a pair of substrates, and a liquid crystal material encapsulated between the pair of substrates.

In a display device according to an embodiment of the present invention, a lower frame arranged in the rear of a display panel has positioning projections, which positioning projections are located outside of a region where the printed circuit board is arranged, at plural positions facing each other with the interposition of the region, and the positioning projections arise from the flat plane of the lower frame toward the printed circuit board. Distal portions of the positioning projections herein protrude from, and bend away from the printed circuit board arranged on or above the lower frame. By this configuration, the printed circuit board can be smoothly mounted to the lower frame even when misregistration occurs. In addition, the printed circuit board can be mounted to the lower frame without damage even when an angle made between the positioning projections and the lower frame is excessively large, for example, exceeding 90 degrees.

The lower frame may have protrusions for fixing the printed circuit board, which protrusions are located inside of the region where the printed circuit board is arranged, and bend so as to support and fix the printed circuit board.

The printed circuit board may have positioning grooves at least in the vicinities of center parts of parallel two sides, which positioning grooves are concave toward the center of the printed circuit board, and the positioning projections of the lower frame may engage with the positioning grooves of the printed circuit board so as to support and fix the printed circuit board. This prevents misregistration in lengthwise and crosswise directions when viewed from above.

The printed circuit board may have a substantially quadrilateral planar shape, and the positioning projections of the lower frame may be arranged at positions facing the four sides of the printed circuit board, respectively.

Examples of the printed circuit board in the display device include a circuit board having a circuit such as a timing controller (TCON substrate), and a circuit board for inputting signals such as control signals from the TCON substrate to a display panel. Of these printed circuit boards, an embodiment of the present invention is preferably applied to the TCON substrate. The TCON substrate herein is arranged in the rear of the lower frame when viewed from a viewer.

The above-mentioned embodiment according to the present invention can be applied to any display devices that include a display panel, a lower frame arranged in the rear of the display panel when viewed from a viewer, and a printed circuit board arranged on or above a flat plane of the lower frame. Among them, the embodiment is preferably applied to a display device having a liquid crystal display panel.

In a display device according to a second embodiment of the present invention, a supporting member and an upper frame support a display panel by holding the outer periphery of the display panel between them. In this display device, the supporting member carries at least one positioning projection arranged on a plane facing the upper frame and protruding toward the upper frame, the upper frame has at least one positioning opening corresponding to the at least one positioning projection of the supporting member, and the opening edge of the upper frame around the positioning opening has an inner periphery and an outer periphery, the outer periphery extending toward the supporting member, and the inner periphery located in the vicinity of the opening edge and extending away from the supporting member. This enables the upper frame to be mounted to the supporting member smoothly even when misregistration occurs upon mounting.

A surface of the inner periphery facing the positioning projection of the supporting member may be curved. This enables the at least one positioning projection of the supporting member to be inserted smoothly into the corresponding at least one positioning opening of the upper frame.

By arranging the positioning opening of the upper frame in the vicinity of the bottom of the positioning projection of the supporting member, the positioning between the supporting member and the upper frame can be more easily and precisely carried out.

The outer periphery of the opening edge may extend toward the supporting member longer than the inner periphery of the opening edge extends away from the supporting member, so as to prevent the inner periphery of the opening edge from protruding from the upper frame.

The second embodiment according to the present invention can be applied to any display devices that include a display panel, and a supporting member and an upper frame holding the display panel between them. The embodiment is desirably applied to a display device having a liquid crystal display panel.

A display device according to a third embodiment of the present invention includes display module, and a cabinet housing the display module, in which the display module includes a display panel and a lower frame located in the rear of the display panel. In this display device, the cabinet has plural positioning projections, which positioning projections are located in the rear of the lower frame when viewed from the viewer, are arranged on a plane facing the lower frame, and protrude and extend toward the lower frame, and the lower frame has positioning openings corresponding to the positioning projections of the cabinet. In addition, the vicinities of opening edges of the peripheries around the positioning openings of the lower frame bend and extend away from a plane facing the cabinet, and surfaces of the bending vicinities facing the positioning openings of the cabinet are curved. This makes positioning of the display module more easily, because the positioning projections of the cabinet can be smoothly inserted into the positioning openings of the lower frame when, for example, the cabinet is partitioned into front and rear cabinets with respect to the display module when viewed from a viewer, and the display module is placed and located in the rear cabinet.

By allowing the bottoms of the positioning projections of the cabinet to have planar areas larger than the opening areas of the corresponding positioning openings of the lower frame, a predetermined clearance is ensured between the display module and the cabinet.

In a display device according to a fourth embodiment of the present invention, the cabinet has at least one positioning opening, and the lower frame has at least one positioning projections corresponding to the positioning opening of the cabinet, in contrast to the third embodiment. In this display device, the opening edge of the cabinet around the positioning opening has an inner periphery and an outer periphery, the outer periphery bends and extends toward the lower frame, and the inner periphery is located in the vicinity of the opening edge, and bends and extends away from the lower frame. This also makes positioning of the display module more easily, because the positioning projection of the lower frame can be smoothly inserted into the positioning opening of the cabinet.

By allowing a surface of the inner periphery facing the positioning projection of the lower frame to be curved, the positioning projection of the lower frame can be further smoothly inserted into the positioning opening of the cabinet.

By arranging the at least one positioning opening of the cabinet in the vicinity of the bottom of the at least one positioning projection of the lower frame, the positioning between the display module and the cabinet can be easily carried out with higher precision.

The outer periphery of the positioning opening of the cabinet may extend toward the lower frame longer than the inner periphery of the opening edge extends away from the lower frame, so as to prevent the inner periphery of the opening edge from protruding from the cabinet.

The third and fourth embodiments according to the present invention can be applied to any display devices that include a display module including a display panel and a lower frame located in the rear of the display panel, and a cabinet housing the display module. They are desirably applied to a display device having a liquid crystal display panel.

A display device herein can be not only a display device according to one of the first, second, third, and fourth embodiments of the present invention but also a display device according to two or more of these embodiments.

In a display device according to at least one of embodiments of the present invention, the positioning upon assembly of the display device can be easily carried out with a higher precision. This reduces imperfect assembly (imperfect mounting) due to misregistration and improves the productivity of the display device.

BRIEF DESCRIPTION OF THE DRAWINGS

These and other features, objects and advantages of the present invention will become more apparent from the following description when taken in conjunction with the accompanying drawings wherein.

DESCRIPTION OF THE PREFERRED EMBODIMENTS

Figure 1:
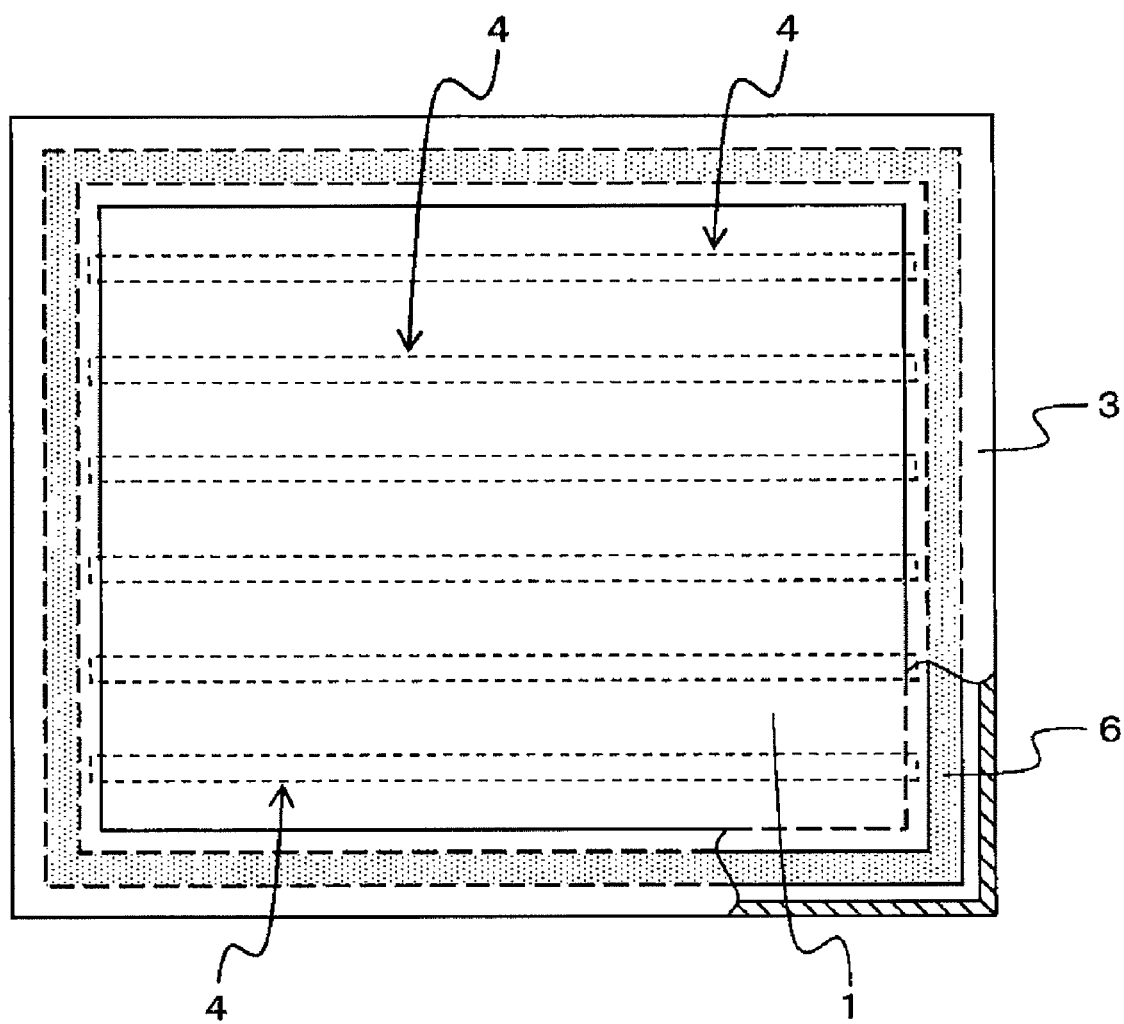
FIG. 1 is a schematic plan view showing the schematic configuration of a liquid crystal display device to which an embodiment of the present invention is adopted.

The present invention will be illustrated in detail below with reference to several embodiments (examples) below and the attached drawings.

In the drawings for illustrating such embodiments and examples, components having the same function are indicated by an identical reference numeral, and repetitive explanation thereof is not shown.

Figure 2:
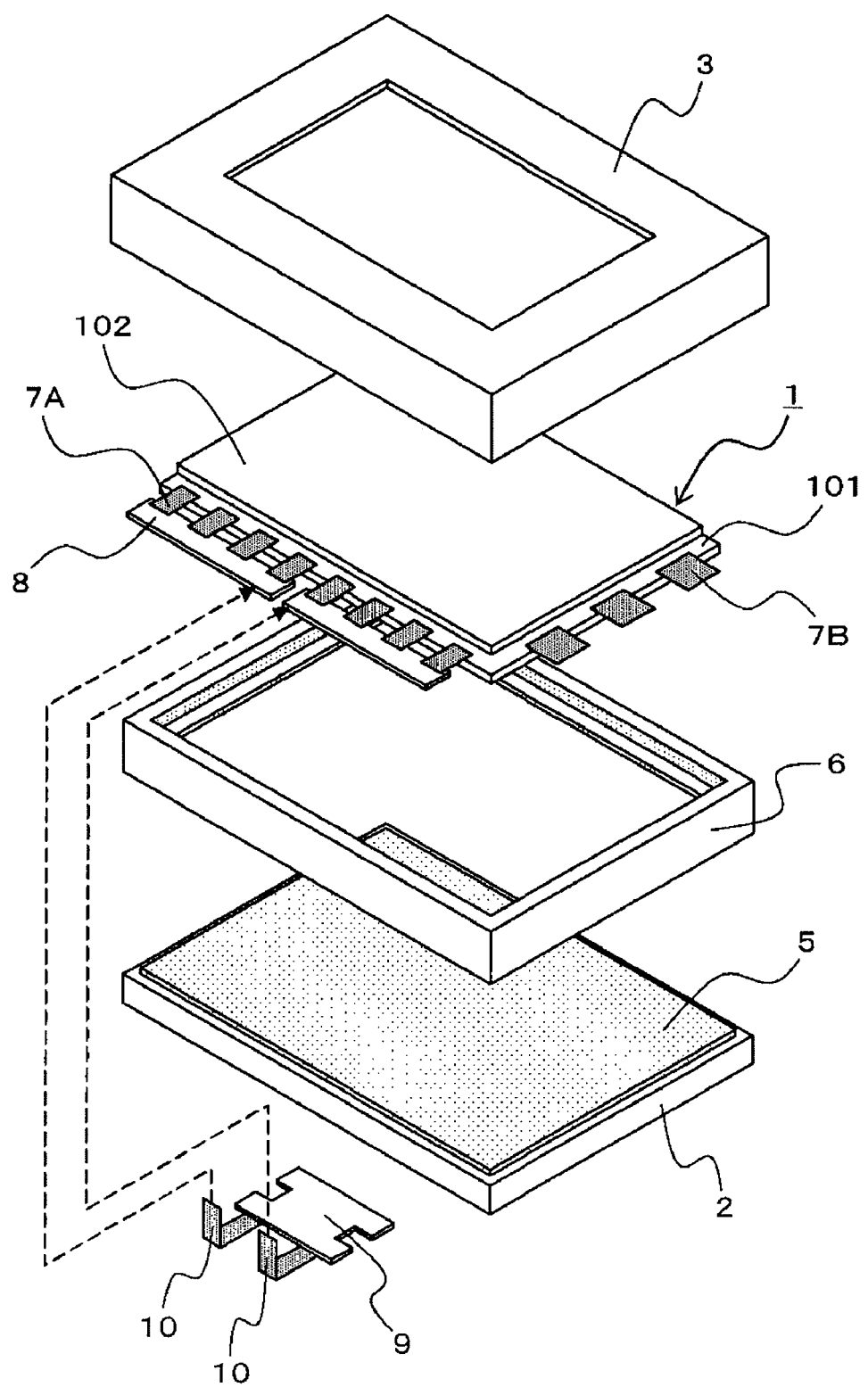
FIG. 2 is a schematic exploded perspective view of the liquid crystal display device of FIG. 1.
Figure 3:
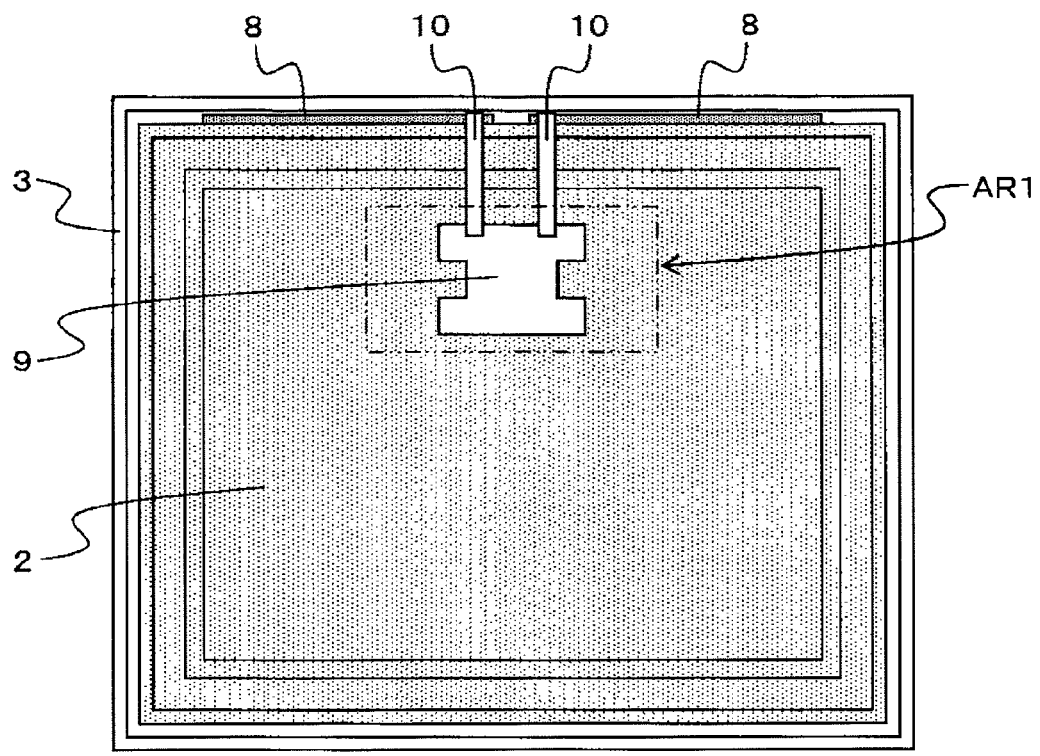
FIG. 3 is a schematic back view of the liquid crystal display device of FIG. 1.

FIGS. 1 to 3 are schematic diagrams illustrating an example of the configuration of a display device according to an embodiment of the present invention.

FIGS. 1 to 3 are a schematic plan view showing the schematic configuration, a schematic exploded perspective view, and a schematic back view, respectively, of a liquid crystal display device according to an embodiment of the present invention.

A display device according to an embodiment of the present invention is a display device such as a liquid crystal display device. Such a liquid crystal display device includes a liquid crystal display panel 1, and a lower frame 2 and an upper frame 3 arranged so as to hold the liquid crystal display panel 1 between them. The lower frame 2 has a substantially box shape and houses, for example, a reflective member and a light source such as a fluorescent tube 4. An optical sheet such as a light-diffuser 5 is arranged between the liquid crystal display panel 1 and the fluorescent tube 4.

A frame-like supporting member 6 formed typically from a resinous molded article is arranged between the liquid crystal display panel 1 and the lower frame 2. The lower frame 2 and the supporting member 6 support the light-diffuser 5 by holding the outer periphery of the light-diffuser 5 between them. The upper frame 3 and the supporting member 6 support the liquid crystal display panel 1 by holding the outer periphery of the liquid crystal display panel 1 between them.

The liquid crystal display panel 1 is a display device including a pair of substrates, i.e., a first substrate (hereinafter referred to as "TFT substrate") 101 and a second substrate (hereinafter referred to as "counter substrate") 102, and a liquid crystal material encapsulated between the pair of substrates. The TFT substrate 101 has plural scanning signal lines, plural picture signal lines, TFT elements, and picture electrodes (each of which is not shown). The picture signal lines are arranged so as to intersect the scanning signal lines three-dimensionally with the interposition of a dielectric layer. The TFT elements and the picture electrodes are arranged in pixel regions each surrounded by adjacent two scanning signal lines and adjacent two picture signal lines. The counter substrate 102 has, for example, color filters. The liquid crystal display panel 1 for use in a display device according to an embodiment of the present invention may be any of liquid crystal display panels used in known liquid crystal display devices, and specific configurations of the TFT substrate 101 and the counter substrate 102 are not shown herein.

The TFT substrate 101 of the liquid crystal display panel 1 is connected typically to a flexible printed circuit board 7A and a flexible printed circuit board 7B (FIG. 2). The flexible printed circuit board 7A serves to input picture signals (also referred to as "tonal data") into the picture signal lines of the TFT substrate 101. The flexible printed circuit board 7B serves to input scanning signals into the scanning signal lines of the TFT substrate 101. The flexible printed circuit boards 7A and 7B each have, for example, a driver integrated circuit (driver IC) mounted thereon. The flexible printed circuit board 7A for inputting picture signals into the picture signal lines is connected, for example, to a rigid printed circuit board 8 (FIG. 2). The rigid printed circuit board 8 connected to the flexible printed circuit board 7A is mounted to an outer peripheral side of the supporting member 6, for example, while bending the flexible printed circuit board 7A.

The rigid printed circuit board 8 connected to the flexible printed circuit board 7A is connected through a flexible print cable 10 to another printed circuit board (TCON substrate) 9 having a control circuit such as a timing controller. The TCON substrate 9 herein is mounted to the rear (bottom face) of the lower frame 2 when viewed from a viewer.

The present invention will be illustrated in further detail with reference to several examples (embodiments) below, by taking a liquid crystal display device having the configuration shown in FIGS. 1 to 3 as an example.

Embodiment 1

Figure 4:
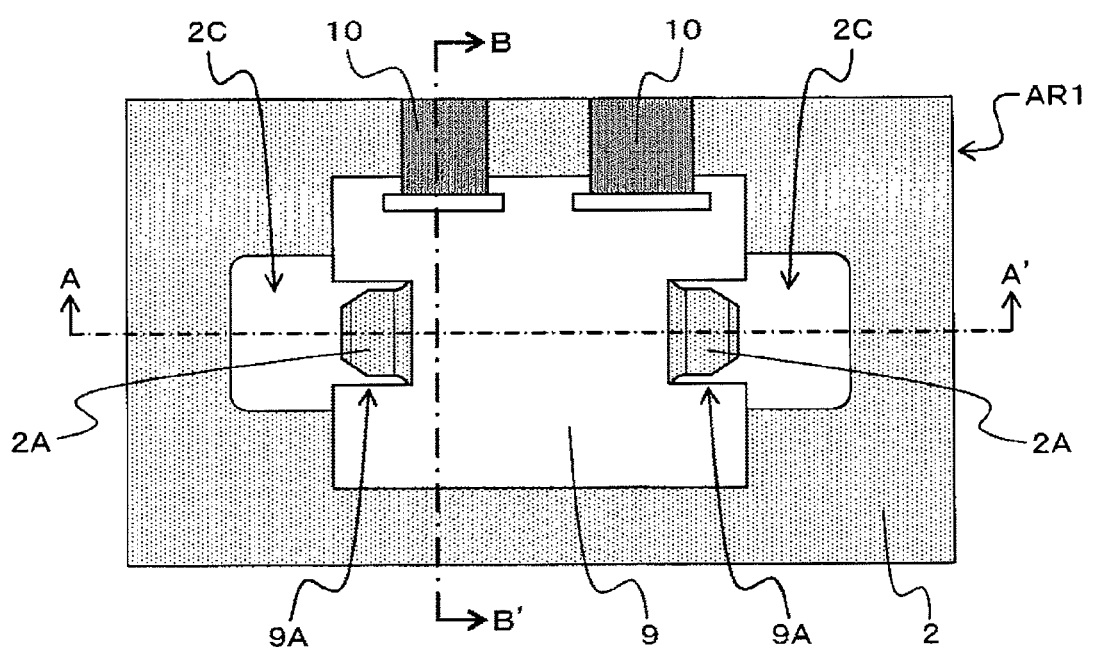
FIG. 4 is a schematic plan view of the area AR1 in FIG. 3, in a display device according to Embodiment 1.
Figure 5:
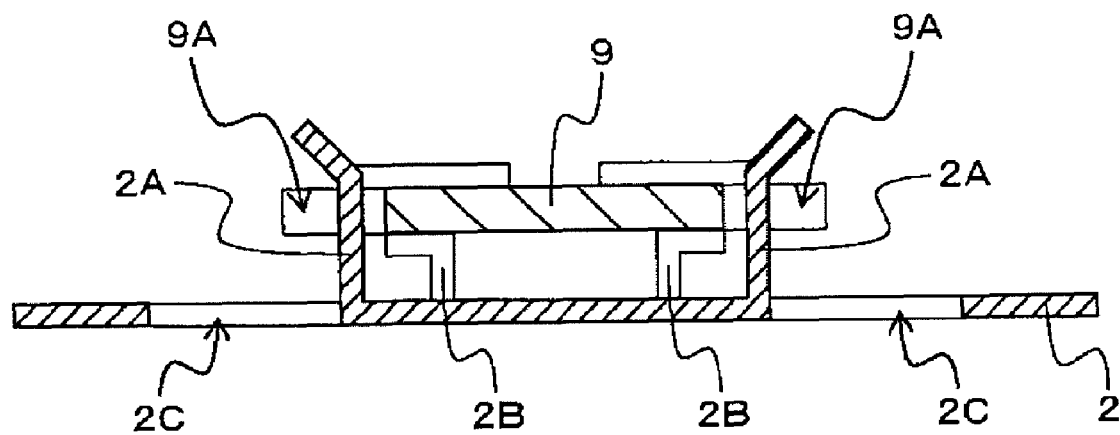
FIG. 5 is a schematic sectional view taken along with the lines A-A' in FIG. 4.
Figure 6:
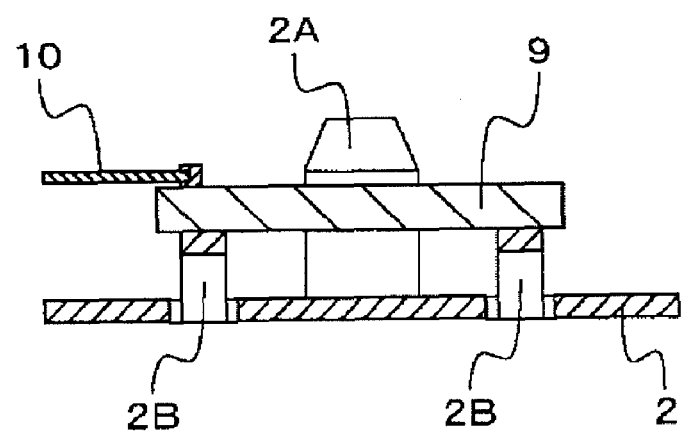
FIG. 6 is a schematic sectional view taken along with the lines B-B' in FIG. 4.

FIGS. 4 to 6 are schematic diagrams showing the schematic configuration of a liquid crystal display device according to Embodiment 1 of the present invention.

FIG. 4 is a schematic plan view of the area AR1 in FIG. 3, and FIGS. 5 and 6 are schematic sectional views taken along with the lines A-A' and the lines B-B', respectively, in FIG. 4.

Embodiment 1 is an embodiment relating to the configuration of a region to which a TCON substrate 9 is mounted in a liquid crystal display device having the configuration shown in FIGS. 1 to 3. The TCON substrate 9 is a printed circuit board having a control circuit such as a timing controller and is generally arranged in the rear of the lower frame 2, namely, at the back of the lower frame 2 when viewed from a viewer. The timing controller controls, for example, the timing of inputting picture signals into picture signal lines and the timing of inputting scanning signals into scanning signal lines in a TFT substrate 101 of a liquid crystal display panel 1.

The lower frame 2 has first projections 2A in a region to which the TCON substrate 9 is mounted. The first projections 2A serve to position the TCON substrate 9 to be mounted (FIGS. 4 to 6). The TCON substrate 9 has grooves 9A in substantially central parts of parallel two sides. The grooves 9A back toward another facing side, respectively. The positioning projections (first projections) 2A of the lower frame 2 fix and position the TCON substrate 9 by pinching the two grooves 9A of the TCON substrate 9.

The lower frame 2 further has second projections 2B in the region to which the TCON substrate 9 is arranged (FIGS. 5 and 6). The second projections 2B serve to fix the TCON substrate 9 at a predetermined height.

The first projections 2A protrude from the lower frame 2 longer than the TCON substrate 9 does. In addition, distal portions of the first projections 2A bend and extend away from the TCON substrate 9 at a position higher than the highest portion of the TCON substrate 9 arranged on the second projections 2B of the lower frame 2. This enables the TCON substrate 9 to be mounted precisely to a predetermined mounting position. This is because, even when the TCON substrate 9 is placed at a horizontally shifted position with respect to the first projections 2A upon positioning of the TCON substrate 9, the grooves 9A of the TCON substrate 9 come in contact with the inclined portions of the first projections 2A and slide horizontally.

The first projections 2A and second projections 2B of the lower frame 2 are formed by punching the lower frame 2 typically with a die to yield projection portions, and bending the projection portions. The lower frame 2 thereby has openings 2C around the region to which the TCON substrate 9 is mounted.

Figure 7:
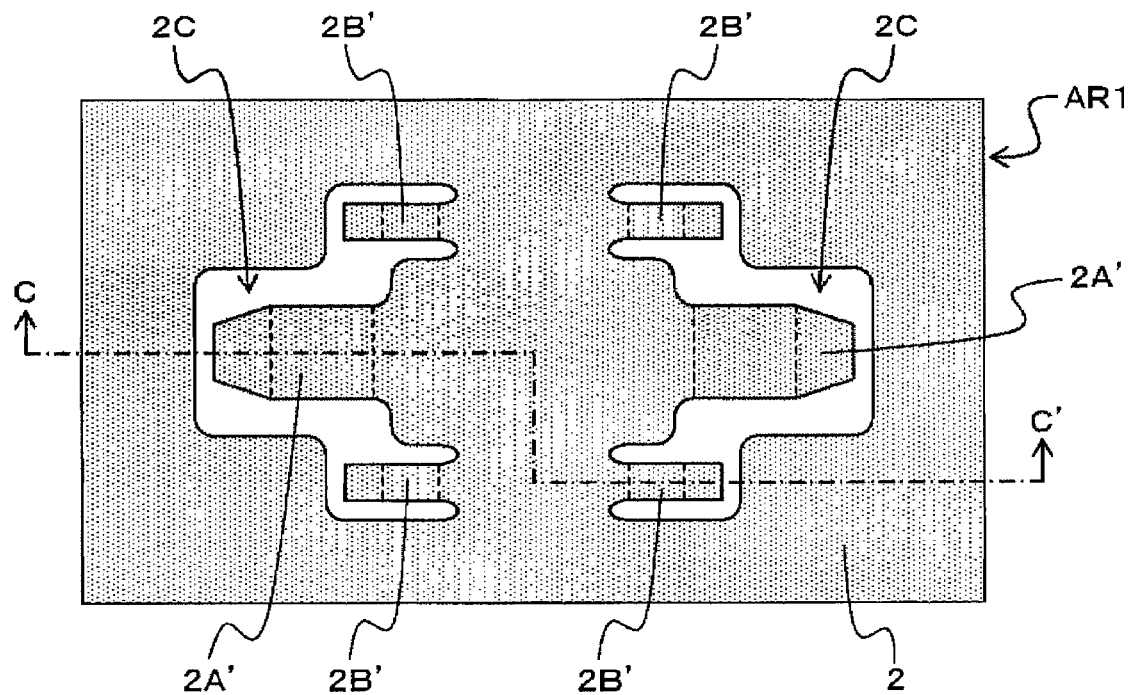
FIG. 7 is a schematic plan view illustrating a step of forming a first protrusion and a second projection in a lower frame.
Figure 8:
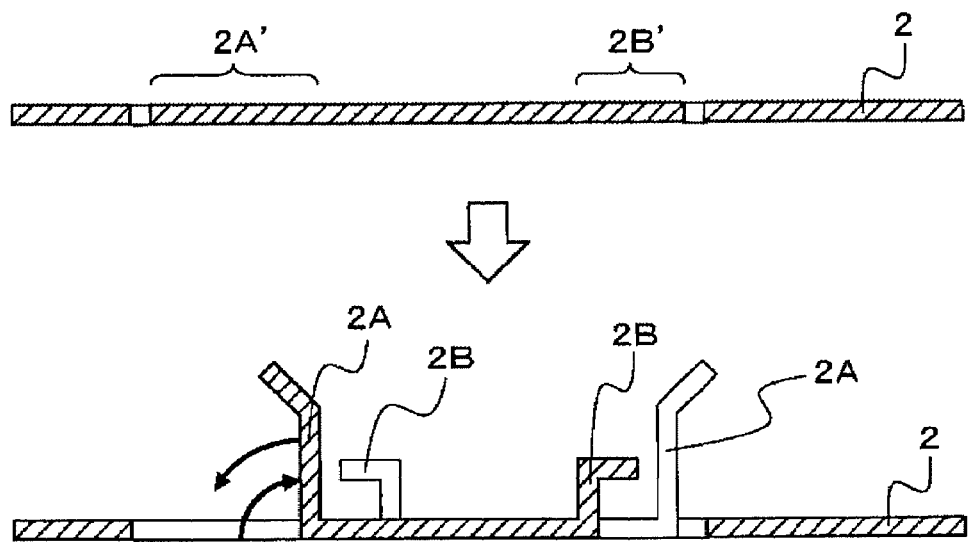
FIG. 8 is a schematic sectional view illustrating the step of forming the first and second projections taken along with the lines C-C' in FIG. 7.

FIGS. 7 and 8 are schematic diagrams for illustrating an example of methods for forming first and second projections of a lower frame.

FIGS. 7 and 8 show a schematic plan view and a schematic sectional view taken along with the lines C-C' in FIG. 7, respectively, of a step of forming the first and second projections in the lower frame.

In the liquid crystal display device according to Embodiment 1, the first projections 2A and second projections 2B of the lower frame 2 are formed, for example, by punching the lower frame 2 typically using a die to yield projection portions and bending the projection portions (FIG. 7 and the upper view of FIG. 8). Specifically, openings 2C are initially formed in a flat plane to be the bottom of the lower frame 2 in a region to which the TCON substrate 9 is mounted and the vicinity thereof. The openings 2C have first projection portions 2A' to be the first projections 2A, and second projection portions 2B' to be the second projections 2B. The openings 2C are formed, for example, by punching with a die. The first projection portions 2A' are so formed as to be located outside of the region to which the TCON substrate 9 is mounted and to extend away from the region to which the TCON substrate 9 is mounted.

Next, the first projection portions 2A' and the second projection portions 2B' formed by punching the lower frame 2 are bent toward the plane on which the TCON substrate 9 is arranged, to thereby form the first projections 2A and the second projections 2B (the lower view of FIG. 8). The first projections 2A and the second projections 2B herein are formed, for example, by bending with a die. By carrying out this procedure, the first projection portions 2A' to be the first projections 2A are bent and deformed (plastically deformed) toward the region to which the TCON substrate 9 is mounted (the lower view of FIG. 8), and a reaction (springback) of the plastic deformation is applied in a direction away from the region to which the TCON substrate 9 is mounted.

Punching of the lower frame 2 and bending of the first projection portions 2A' and the second projection portions 2B' can be carried out not only in two steps as described above, but also in one step.

Figure 9:
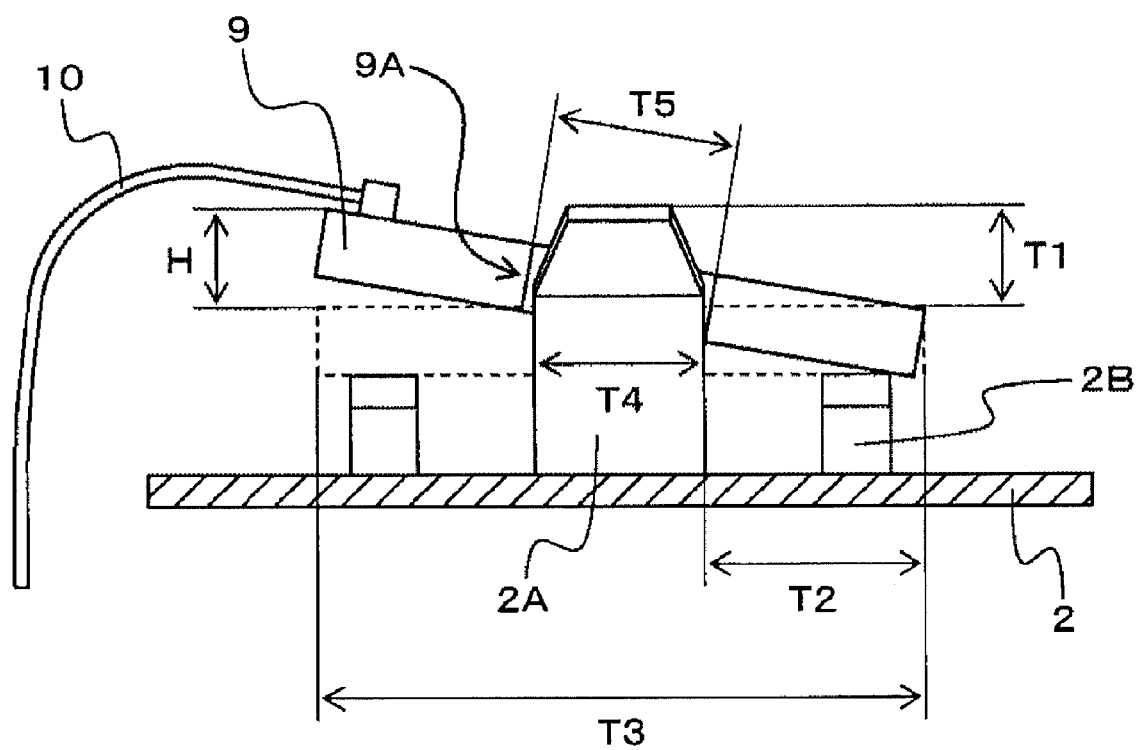
FIG. 9 is a schematic diagram showing how a TCON substrate is mounted depending on the dimensions of the first projection.

FIG. 9 is a schematic diagram showing how a TCON substrate is mounted depending on the dimensions of the first projections. FIG. 9 is a view of the area AR1 in FIG. 4 when viewed from the left hand.

In the display device according to Embodiment 1, the first projections 2A of the lower frame 2 are arranged so as to protrude from the lower frame 2 higher (longer) than the TCON substrate 9 does, as illustrated in FIG. 5. The TCON substrate 9 can be easily mounted to a proper position by bending distal portions of the first projections 2A away from the TCON substrate 9, the distal portions protruding higher than the TCON substrate 9.

The TCON substrate 9 is generally connected to a rigid printed circuit board 8 (not shown) through a flexible print cable 10 (FIG. 9) before it is mounted to the lower frame 2. Accordingly, when the TCON substrate 9 is placed at a mounting position of the lower frame 2, an edge of the TCON substrate 9 connected to the flexible print cable 10 may be lifted from the lower frame 2 (FIG. 9). To prevent misregistration of the TCON substrate 9 even when the edge of the TCON substrate 9 is connected to the flexible print cable 10, the height T1 preferably satisfies the following conditions, wherein the height T1 is a height of a portion of the first projection 2A at a position higher than the TCON substrate 9 provided that the TCON substrate 9 is properly mounted.

With reference to FIG. 9, initially, the height T1 of a portion of the first projection 2A at a position higher than the TCON substrate 9 is preferably set so as to satisfy the following Formula (1):

$$T1 > [(T2/T3)H]  \qquad \text{Formula (1)}$$

wherein T2 is the distance between the first projection 2A and the edge of the TCON substrate 9 provided that the TCON substrate 9 is properly mounted; T3 is the width of the TCON substrate 9; and H is the maximum distance between the edge of the TCON substrate 9 connected to the flexible print cable 10 when the edge is lifted.

The width T4 of the first projection 2A is preferably set smaller than the width T5 of the groove 9A of the TCON substrate 9, in order to mount the TCON substrate 9 to a proper position even when the edge of the TCON substrate 9 connected to the flexible print cable 10 is lifted (FIG. 9).

However, the width T4 of the first projections 2A and the width T5 of the groove 9A of the TCON substrate 9 are preferably set further in view of the precision in positioning, because the positioning precision in a horizontal direction in FIG. 9 may deteriorate if the difference between the width T5 and the width T4 is excessively large.

As is described above, according to the liquid crystal display device of Embodiment 1, the TCON substrate 9 can be mounted to a proper position, even when misregistration occurs upon positioning of the TCON substrate 9 before it is mounted. The liquid crystal display device can be more resistant to imperfect mounting due to misregistration, and more improved in productivity of the liquid crystal display device, not only when it is manually assembled but also when it is automatically assembled using an assembly machine.

Figure 10:
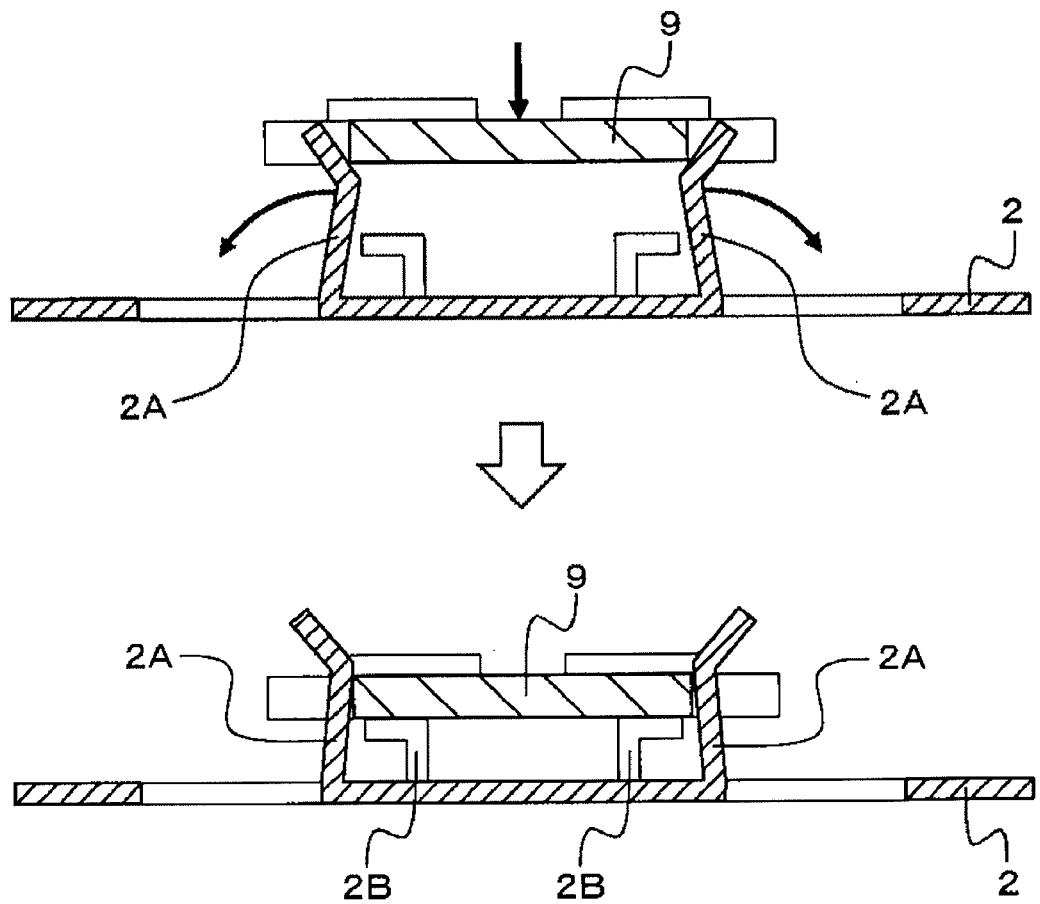
FIG. 10 is a schematic diagram showing other operation and advantages of the liquid crystal display device according to Embodiment 1.

FIG. 10 is a schematic diagram showing other operations and advantages of a liquid crystal display device according to Embodiment 1.

In a liquid crystal display device according to Embodiment 1, the first projections 2A of the lower frame 2 are formed by bending portions outside of the region to which the TCON substrate 9 is mounted. They are bent toward the region to which the TCON substrate 9 is mounted. Accordingly, the first projections 2A may be bent at an angle exceeding 90 degrees (the upper view of FIG. 10), because of imperfect bending in bending procedure or external force applied in a subsequent step. This makes the distance between first projections 2A facing each other smaller than the distance between the grooves 9A of the TCON substrate 9.

However, in the display device according to Embodiment 1, the first projections 2A easily expand outward when the TCON substrate 9 is pushed thereinto, and the TCON substrate 9 can be easily mounted to a proper position at a proper height (the lower view of FIG. 10). This is because a reaction (springback) of bending deformation (plastic deformation) occurs in the first projections 2A outward away from the region to which the TCON substrate 9 is mounted.

Figure 11:
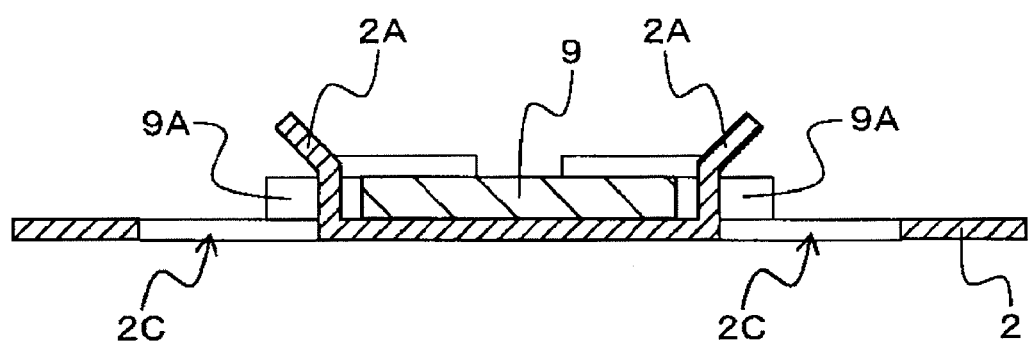
FIG. 11 is a schematic sectional view illustrating a first modified embodiment of the liquid crystal display device according to Embodiment 1.

FIG. 11 is a schematic sectional view illustrating a first modified embodiment of a liquid crystal display device according to Embodiment 1 and is a diagram corresponding to the cross section taken along with the lines A-A' in FIG. 4.

A liquid crystal display device according to Embodiment 1 has been illustrated in FIGS. 5 and 6 by taking, as an example, a device in which the lower frame 2 further has second projections 2B inside of the region to which the TCON substrate 9 is mounted, which second projections 2B serve to control the height of the TCON substrate 9 to be mounted. However, a liquid crystal display device according to Embodiment 1 may have another configuration than this configuration. For example, the liquid crystal display device may not include second projections, as illustrated in FIG. 11. Such a display device having the configuration shown in FIG. 11 is naturally so configured as not to carry a chip-like circuit component, such as a capacitor element, on a plane of the TCON substrate 9 facing the lower frame 2. A display device having the configuration shown in FIG. 11 preferably further includes an insulating film (dielectric film) or sheet between the TCON substrate 9 and the lower frame 2.

Figure 12:
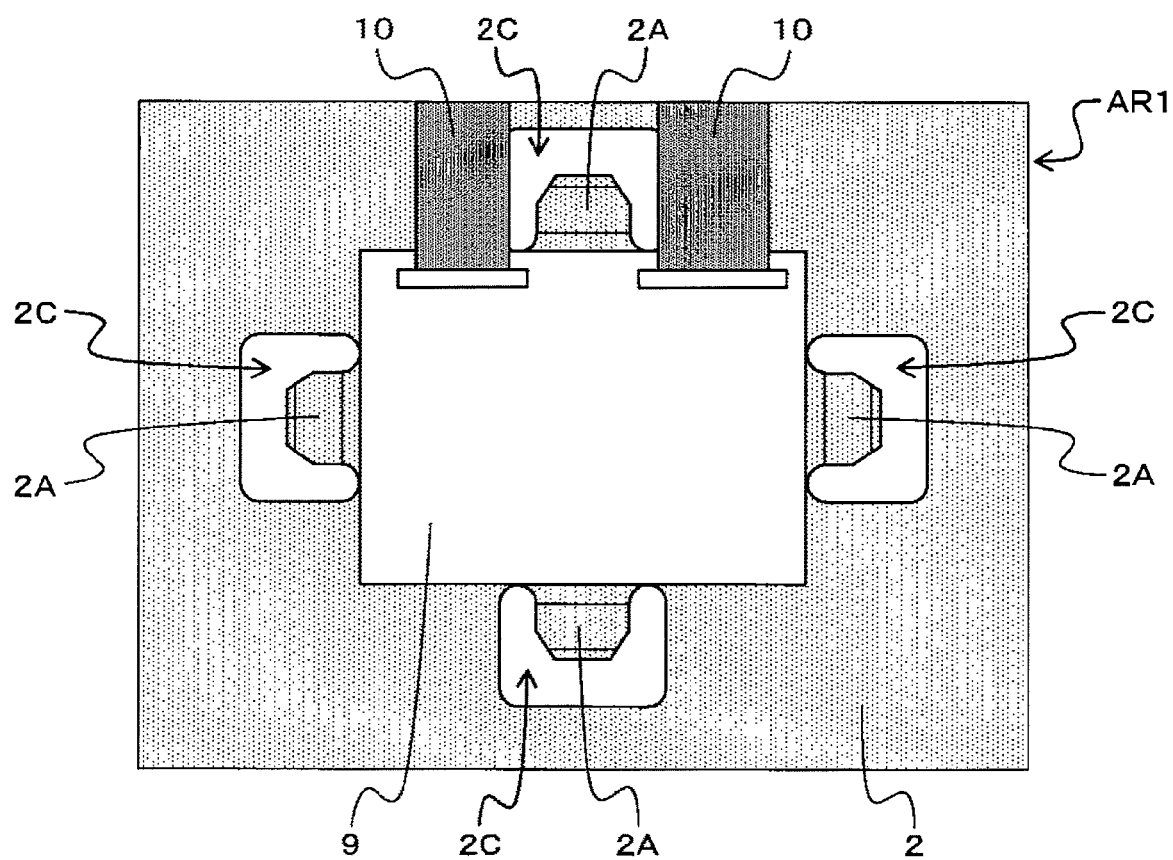
FIG. 12 is a schematic plan view illustrating a second modified embodiment of the liquid crystal display device according to Embodiment 1.

FIG. 12 is a schematic plan view illustrating a second modified embodiment of a liquid crystal display device according to Embodiment 1 and is a plan view corresponding to the area AR1 in FIG. 3.

The liquid crystal display device according to Embodiment 1 has been illustrated in FIG. 4 by taking, as an example, a device in which two first projections 2A are arranged so as to hold a pair of parallel sides of the TCON substrate 9 between them. However, a liquid crystal display device according to Embodiment 1 may have another configuration than this configuration. For example, the liquid crystal display device may have four first projections 2A at positions corresponding to the four sides of a TCON substrate 9 having a substantially quadrilateral shape. In this configuration, the TCON substrate 9 can be positioned in a lengthwise direction by the action of two first projections 2A arranged in the lengthwise direction of the TCON substrate 9. Likewise, it can be positioned in a widthwise direction by the action of two first projections 2A arranged in the widthwise direction of the TCON substrate 9. This eliminates the need of arranging grooves 9A in the TCON substrate 9 (FIG. 4), which allows the routing of interconnections on the TCON substrate 9 leeway.

In Embodiment 1, the first projections 2A may be formed by punching the lower frame 2 to form first projection portions 2A' and bending first projection portions 2A' (FIGS. 7 and 8). The formation procedure of the first projections 2A, however, is not limited thereto, and the first projections 2A may also be formed, for example, by drawing with a die in a position of the lower frame 2 outside of the region to which the TCON substrate 9 is mounted.

Figure 13:
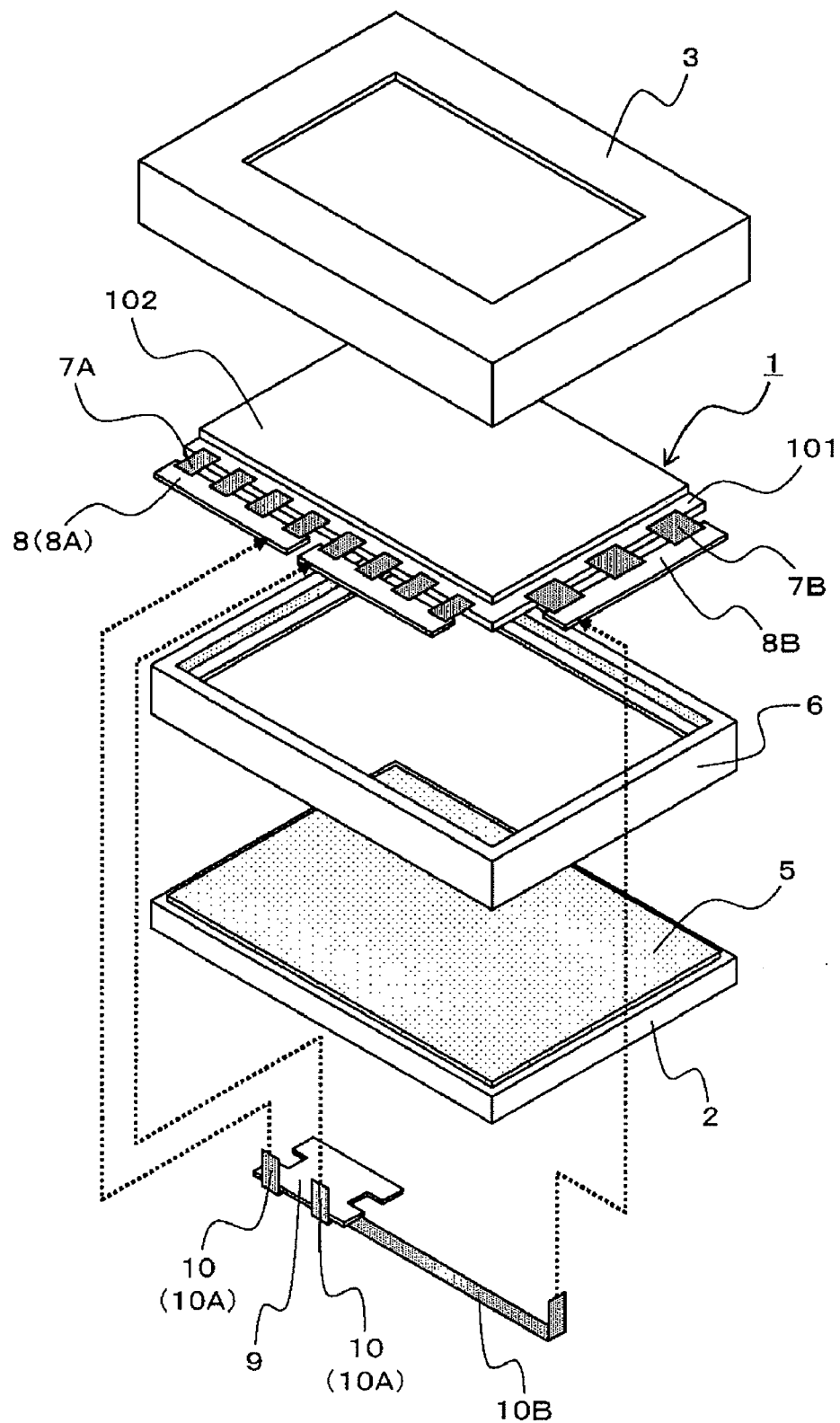
FIG. 13 is a schematic exploded perspective view illustrating a third modified embodiment of the liquid crystal display device according to Embodiment 1.

FIG. 13 is a schematic exploded perspective view illustrating a third modified embodiment of a liquid crystal display device according to Embodiment 1.

A liquid crystal display device according to Embodiment 1 has been illustrated by taking, as an example, a display device in which only the flexible printed circuit board 7A connected to picture signal lines of the liquid crystal display panel 1 (TFT substrate 101) is connected to the rigid printed circuit board 8 (FIGS. 2 and 3). In a liquid crystal display device having this configuration, control signals from the TCON substrate 9 are inputted into the flexible printed circuit board 7B through the rigid printed circuit board 8, the flexible printed circuit board 7A connected to the picture signal lines, and interconnections arranged on the TFT substrate 101. These control signals serve to control the flexible printed circuit board 7B connected to scanning signal lines of the liquid crystal display panel 1.

A liquid crystal display device according to Embodiment 1, however, may have another configuration than this configuration. For example, it is naturally acceptable that a flexible printed circuit board 7B connected to scanning signal lines is connected to another rigid printed circuit board 8B, and the rigid printed circuit board 8B is connected to the TCON substrate 9 through another flexible print cable 10B.

Embodiment 2

Figure 14:
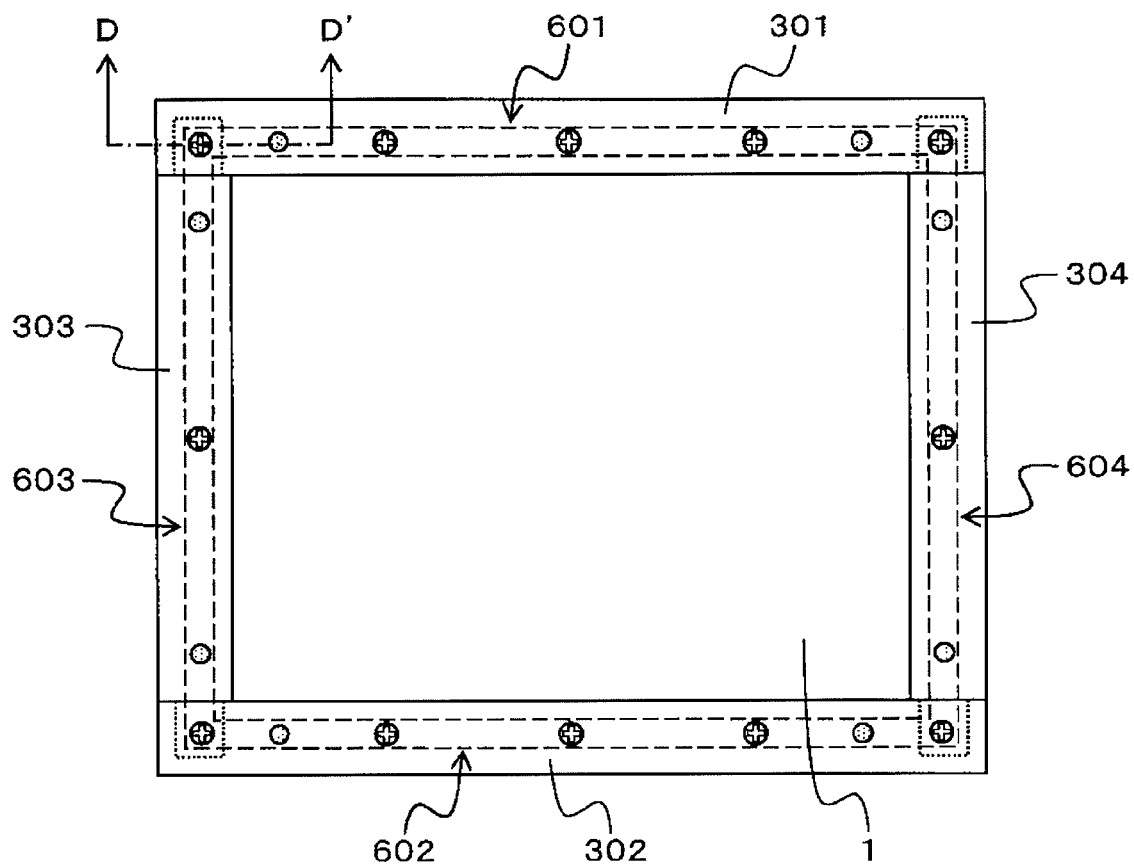
FIG. 14 is a schematic plan view of a liquid crystal display device according to Embodiment 2 when viewed from a display screen side.
Figure 15:
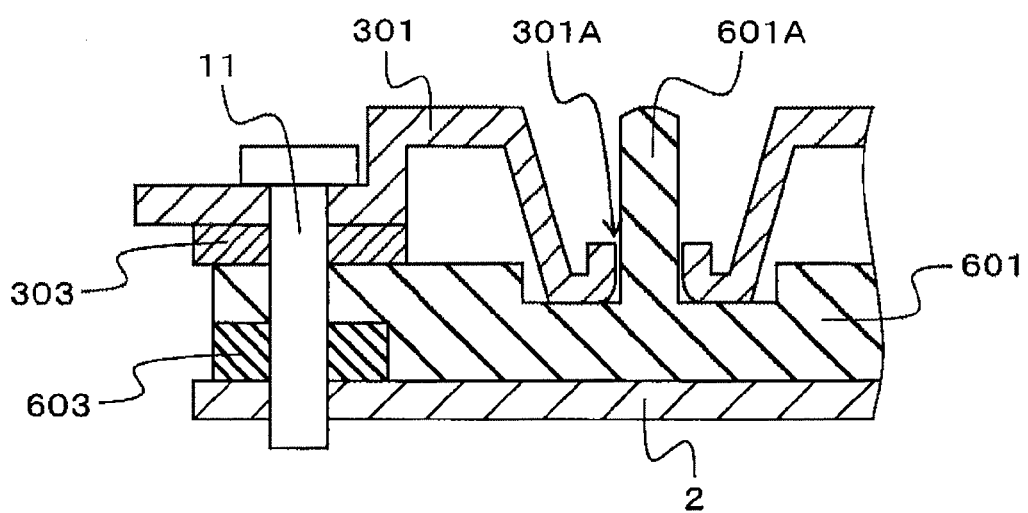
FIG. 15 is a schematic sectional view taken along with the lines D-D' in FIG. 14.
Figure 16:
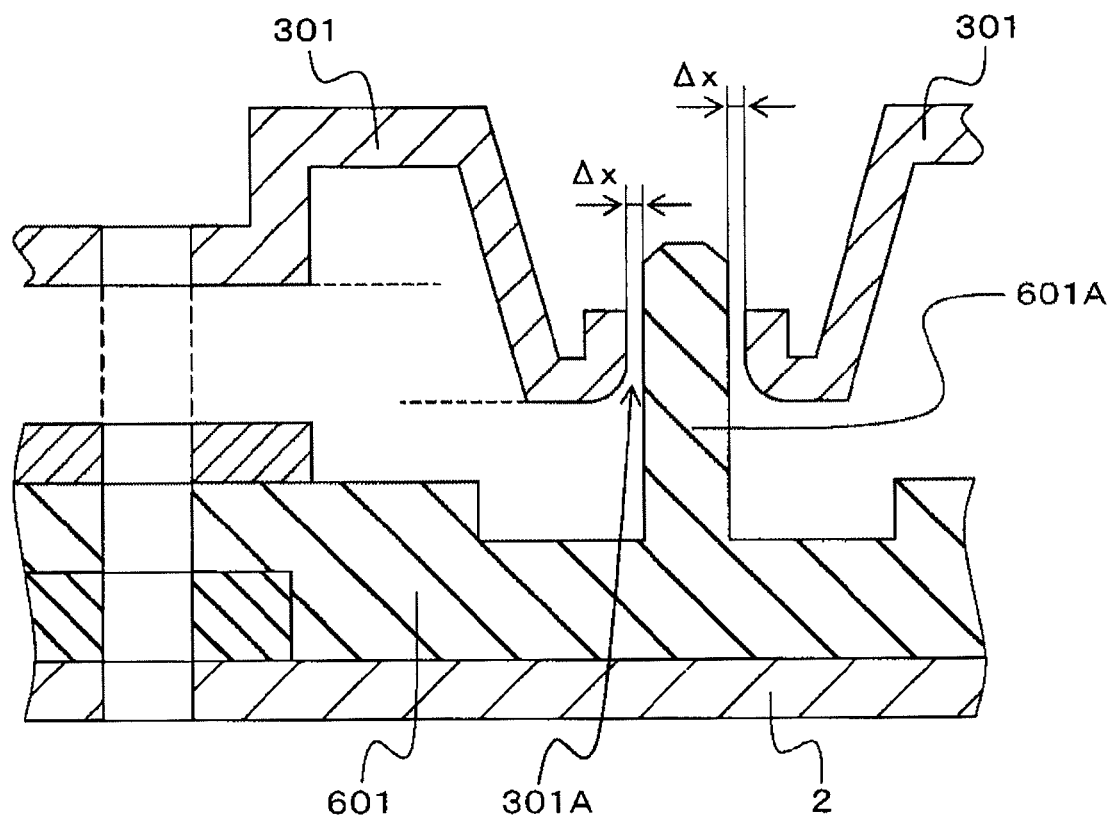
FIG. 16 is a schematic sectional view illustrating the configuration of the liquid crystal display device according to Embodiment 2.

FIGS. 14 to 16 are schematic diagrams showing a schematic configuration of a liquid crystal display device according to Embodiment 2 of the present invention.

FIG. 14 is a schematic plane view of the liquid crystal display device when viewed from a display screen side, and FIGS. 15 and 16 are schematic sectional views taken along with the lines D-D' in FIG. 14. FIG. 16 is a schematic sectional view illustrating a configuration of a liquid crystal display device according to Embodiment 2.

Configurations have been illustrated in Embodiment 1 for facilitating the positioning of the TCON substrate 9 mounted to the lower frame 2 and for reducing imperfect mounting due to misregistration. Assembly of a liquid crystal display device, however, includes other portions (steps) requiring the positioning. In Embodiment 2, positioning between a supporting member 6 and an upper frame 3 is taken as an example of other portions requiring positioning, and configurations for facilitating the positioning and for reducing imperfect mounting due to misregistration will be illustrated.

In a liquid crystal display device, the supporting member 6 and the upper frame 3 hold and support an outer periphery of a liquid crystal display panel 1 between them. They each include four substantially rod-like members partitioned along with the four sides of the liquid crystal display panel 1 having a substantially quadrilateral shape (FIGS. 14 and 15). These four members are overlapped at corners and are fixed typically by screwing to form an integral frame-like member. A supporting member 601 has positioning projection 601A, and an upper frame 301 has a positioning opening 301A (FIG. 15) in the vicinity of the upper left corner of the liquid crystal display device in FIG. 14. The positioning projection 601A and the positioning opening 301A are provided for positioning screw holes for screwing two supporting members 601 and 603 with two upper frames 301 and 303 using a screw 11.

In the liquid crystal display device according to Embodiment 2, of a portion of the upper frame 301 around the positioning opening 301A, the vicinity of the opening edge bends and extends away from the supporting member 601, and an outside area thereof bends and extends toward the supporting member 601 (FIGS. 15 and 16). The portion of the upper frame 301 around the positioning opening 301A may be processed into this shape, for example, by punching with a die and drawing.

The positioning opening 301A of the upper frame 301 is formed so as to have a diameter after bending the opening edge larger than the diameter of the positioning projection 601A of the supporting member 601. For example, it may be formed so as to have a clearance $\Delta x$ of about 0.1 mm. The positioning opening 301A of the upper frame 301 is preferably formed so as to have a curved surface on a plane facing the supporting member 601, namely, to allow the entrance of the positioning projection 601A of the supporting member 601 to be curved.

The periphery of the upper frame 301 around the positioning opening 301A is preferably arranged so as to protrude and extend toward the supporting member 601 longer than the bending portion of the opening edge protrudes and extends away from the supporting member 601, in order to prevent the bending portion of the opening edge from protruding from the upper frame 301.

FIGS. 17 to 20 are schematic sectional views for illustrating operation and advantages of a liquid crystal display device according to Embodiment 2.

Figure 17:
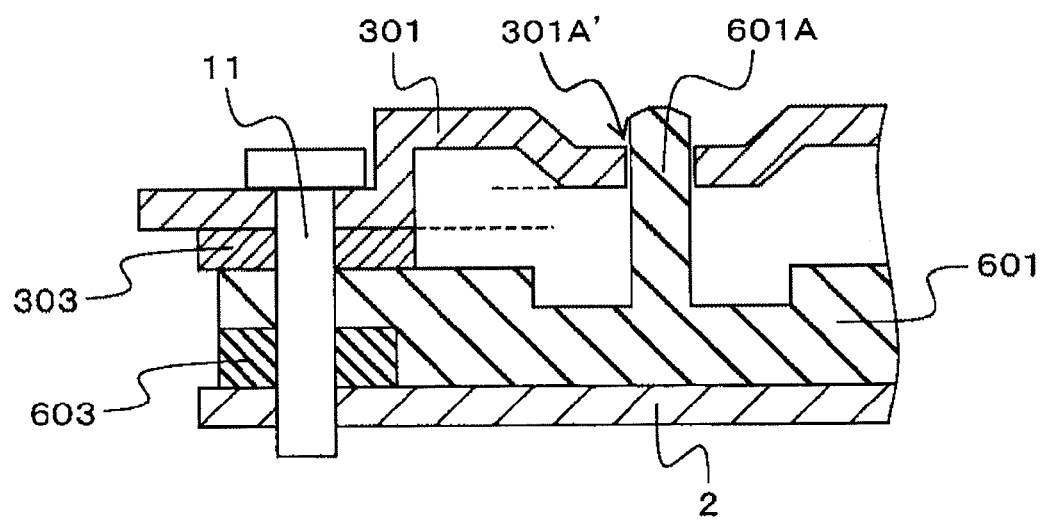
FIG. 17 is a schematic sectional view illustrating an example of the configuration of a positioning section between a supporting member and an upper frame in a known liquid crystal display device in related art.
Figure 18:
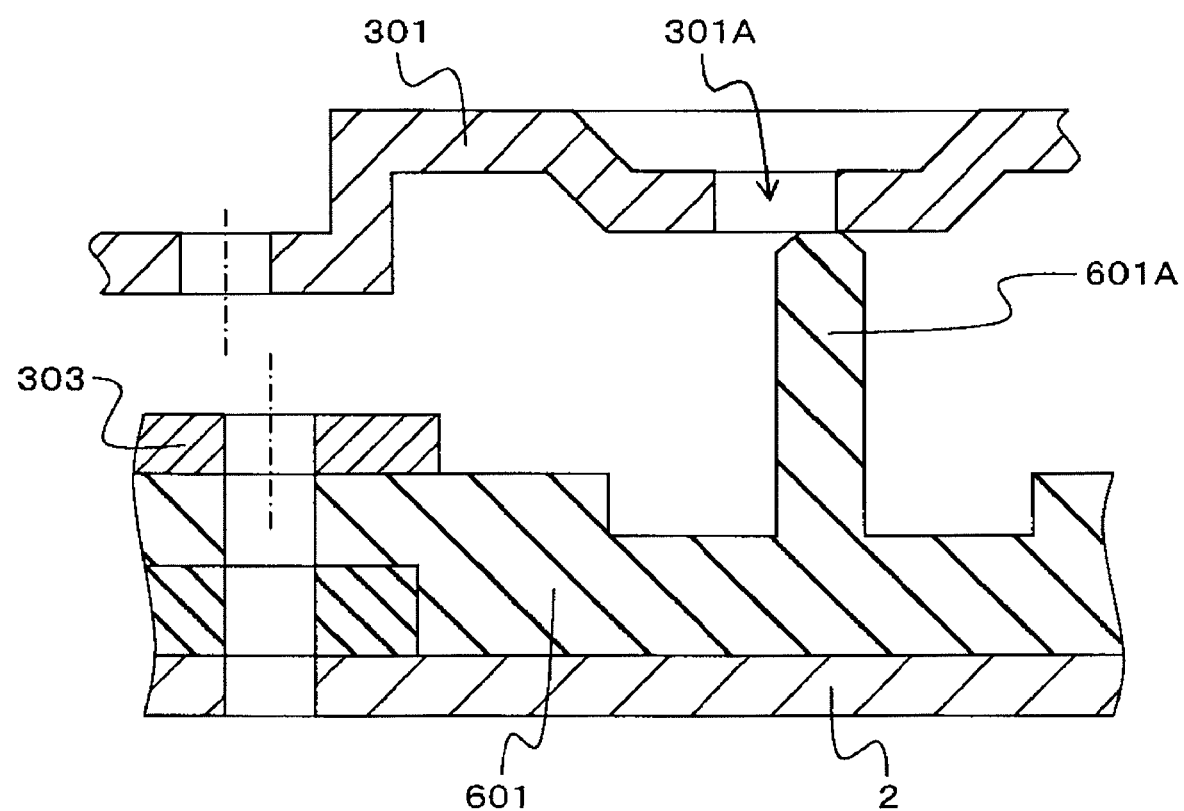
FIG. 18 is a schematic sectional view illustrating one of problems in the configuration in FIG. 17.
Figure 19:
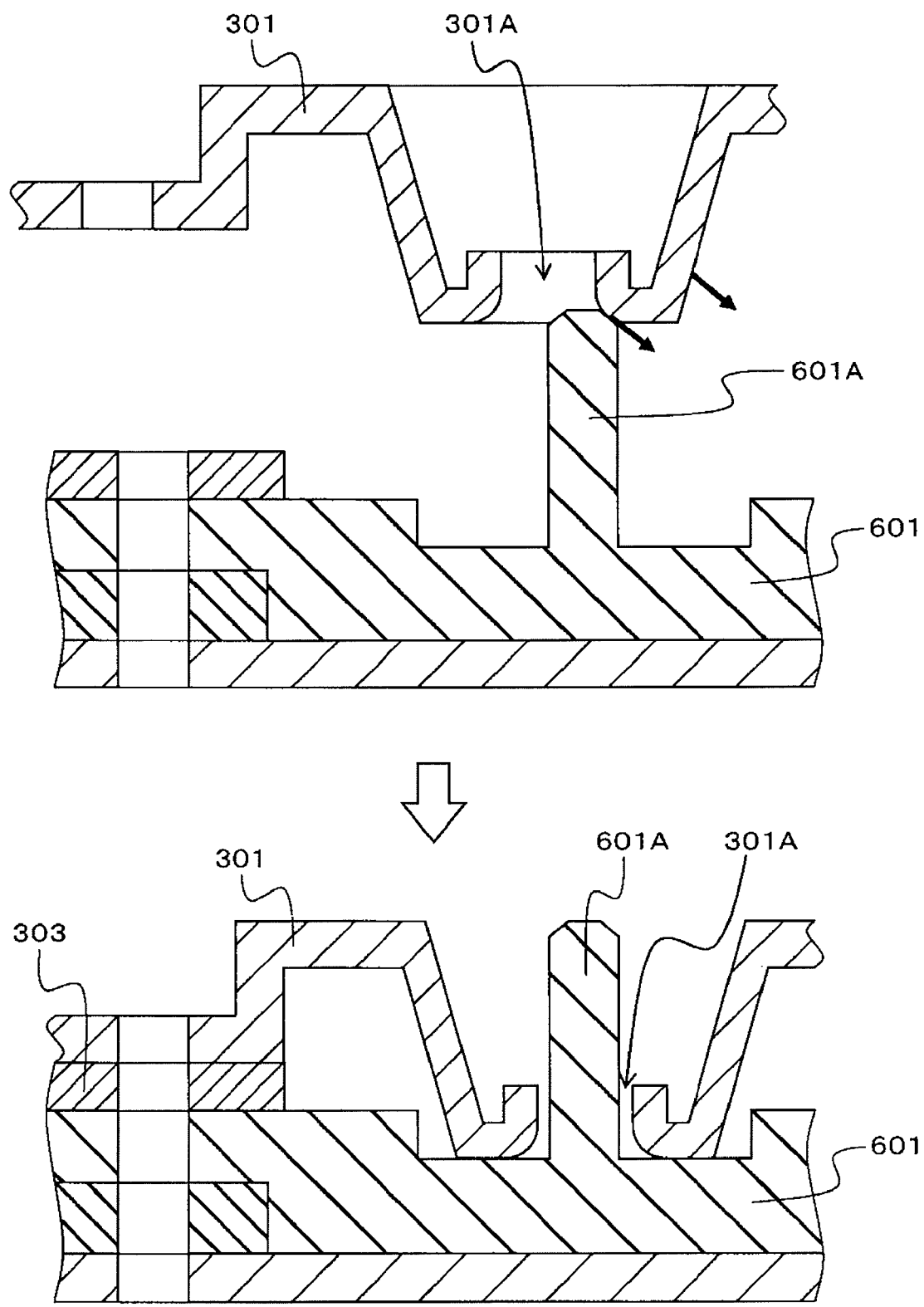
FIG. 19 is a schematic diagram illustrating operation and advantages of the liquid crystal display device according to Embodiment 2 by way of example.
Figure 20:
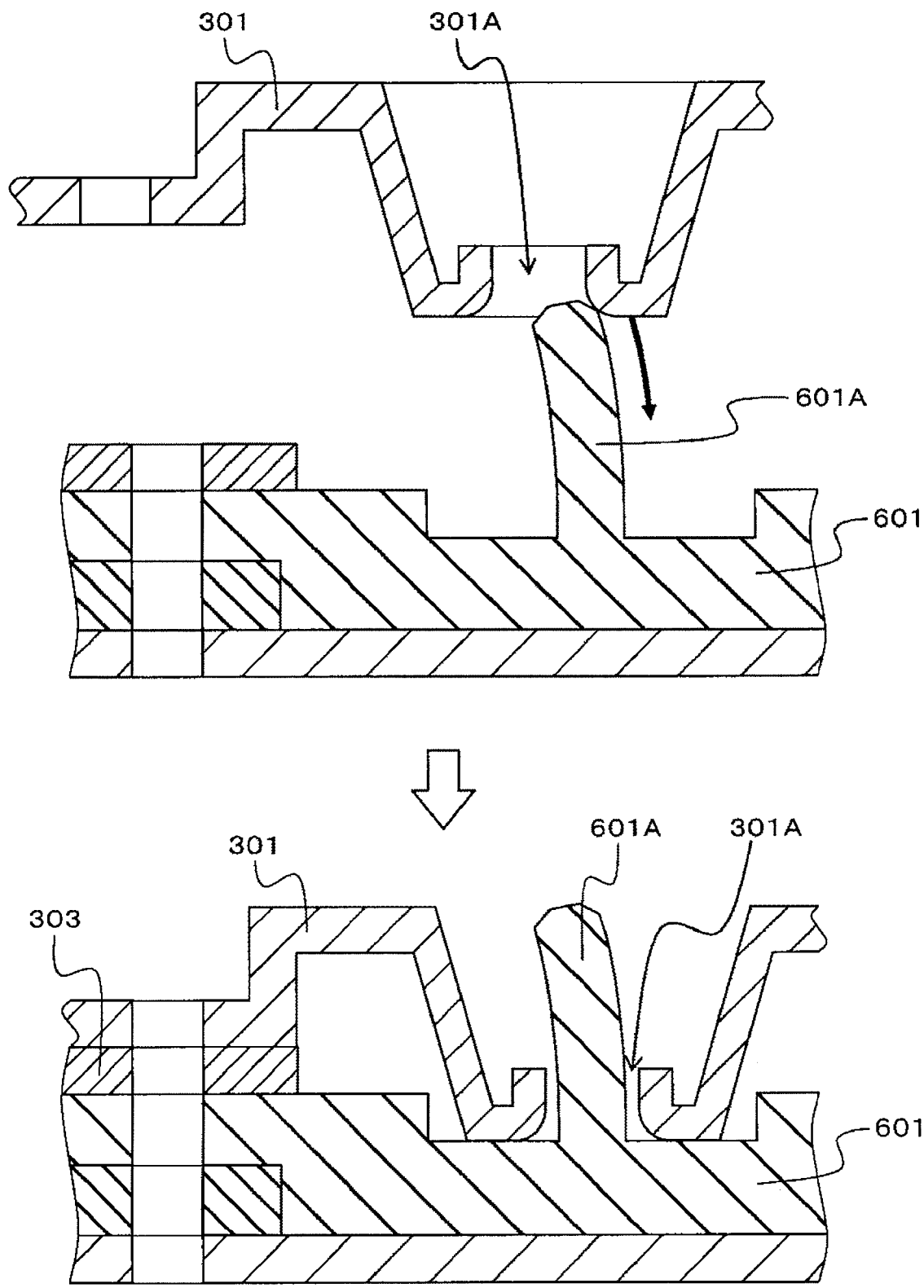
FIG. 20 is a schematic diagram illustrating another example of operation and advantages of the liquid crystal display device according to Embodiment 2.

FIG. 17 is a schematic sectional view of an example of the configuration of a positioning section between a supporting member and an upper frame in a known liquid crystal display device in related art, and FIG. 18 is a schematic sectional view illustrating one of problems in the configuration in FIG. 17. FIGS. 19 and 20 are schematic diagrams illustrating examples of operations and advantages of a liquid crystal display device according to Embodiment 2, respectively. FIGS. 17 to 20 are sectional views corresponding to the cross section taken along with the lines D-D' in FIG. 14.

The known liquid crystal display device also includes a positioning projection 601A in a supporting member 601, and a positioning opening 301A in an upper frame 301 for positioning between the supporting member 601 and the upper frame 301. In the known liquid crystal display device, however, the positioning opening 301A of the upper frame 301 is frequently formed only by punching the upper frame 301 with a die and allowing the periphery of the opened area to protrude and extend toward the supporting member 601.

Specifically, in the known liquid crystal display device, the positioning opening 301A of the upper frame 301 has a square opening edge. Accordingly, when misregistration occurs between the positioning projection 601A of the supporting member 601 and the positioning opening 301A of the upper frame 301 as shown in FIG. 18, the positioning projection 601A may fail to be inserted into the positioning opening 301A. The configuration of the known liquid crystal display device thereby causes poor workability in positioning and mounting of the upper frame 301.

In contrast, the positioning opening 301A of the upper frame 301 in the liquid crystal display device according to Embodiment 2 has a curbed surface. Accordingly, even when misregistration occurs between the positioning projection 601A of the supporting member 601 and the positioning opening 301A of the upper frame 301, the positioning projection 601A slides along with the curbed surface of the positioning opening 301A (the upper view of FIG. 19). Accordingly, the positioning projection 601A is smoothly inserted into the positioning opening 301A, and the upper frame 301 can be easily mounted to a proper position (the lower view of FIG. 19).

In the known liquid crystal display device, the positioning opening 301A of the upper frame 301 is often located at a position away from the bottom of the positioning projection 601A of the supporting member 601 when the upper frame 301 is placed on the supporting member 601. The supporting member 601 is generally formed by molding a molten resin, and, for example, the positioning projection 601A of the supporting member 601 may curve. In this case, misregistration of the upper frame 301 may occur in the known liquid crystal display device even though the positioning projection 601A of the supporting member 601 is inserted into the positioning opening 301A of the upper frame 301.

In contrast, the liquid crystal display device according to Embodiment 2 is more resistant to misregistration of the upper frame 301 than the known liquid crystal display device is. In the liquid crystal display device according to Embodiment 2, the portion of the upper frame 301 around the positioning opening 301A largely protrudes toward the supporting member 601 (the upper and lower views of FIG. 20). When the positioning projection 601A of the supporting member 601 is inserted into the positioning opening 301A of the upper frame 301, positioning is carried out between the bottom of the positioning projection 601A of the supporting member 601 and the positioning opening 301A of the upper frame 301 (the lower view of FIG. 20). This reduces the misregistration, because the dislocation due to curving is small at the bottom of the positioning projection 601A of the supporting member 601 even if the positioning projection 601A curves.

Likewise, positioning of other portions, such as positioning between the supporting member 602 and the upper frame 302, can be easily carried out and misregistration of the upper frame can be reduced by allowing a positioning opening and an area around the same of the upper frame to have dimensions as shown in FIGS. 15 and 16. Repetitive description, however, is not shown herein.

As is described above, misregistration of the upper frame 3 upon mounting of the upper frame 3 to the supporting member 6 can be easily prevented in a liquid crystal display device according to Embodiment 2. Consequently, imperfect mounting due to misregistration can be reduced, and the productivity of the display device can be improved not only in manual assembly but also in automatic assembly using an assembly machine.

A display device according to Embodiment 2 has been illustrated by taking, as an example, a device in which the supporting member 6 and the upper frame 3 are each partitioned into four parts along with the four sides of the liquid crystal display panel 1. However, the configuration of these members are not limited thereto, and they may one frame-like supporting member and one frame-like upper frame, respectively. Also in this case, misregistration typically of a screw hole for screwing and fixing the supporting member 6 and the upper frame 3 and a screw hole for screwing and fixing the upper frame 3 can be easily prevented by configuring a positioning section of the supporting member 6 and the upper frame 3 as shown in FIG. 15.

In Embodiment 2, attention is focused only on a positioning section between the supporting member and the upper frame, and the configuration thereof is illustrated. It should be noted, however, that this configuration can be employed in combination with the configuration of the mounting portion between the TCON substrate and the lower frame as illustrated in Embodiment 1.

Embodiment 3

Liquid crystal display devices as illustrated in Embodiments 1 and 2 having the configuration shown in FIGS. 1 to 3 are generally known as liquid crystal display modules. So-called display devices such as displays for television sets or personal computers each generally include a cabinet (casing) housing a liquid crystal display module having the configuration shown in FIGS. 1 to 3, and other components such as input terminals. When the liquid crystal display module is housed in the cabinet, positioning typically between the liquid crystal display module and the cabinet is required. Accordingly, configurations for facilitating the positioning between the liquid crystal display module and the cabinet with a higher precision will be illustrated in Embodiment 3.

Figure 21:
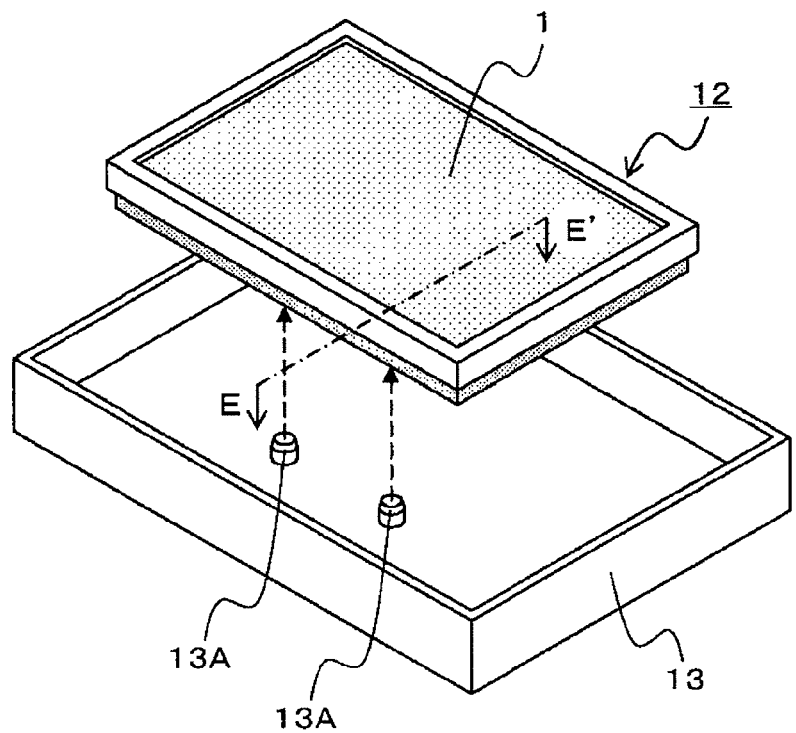
FIG. 21 is a schematic perspective view illustrating schematic configurations of a liquid crystal display module and a cabinet arranged in the rear of the module in a liquid crystal display device according to Embodiment 3.
Figure 22:
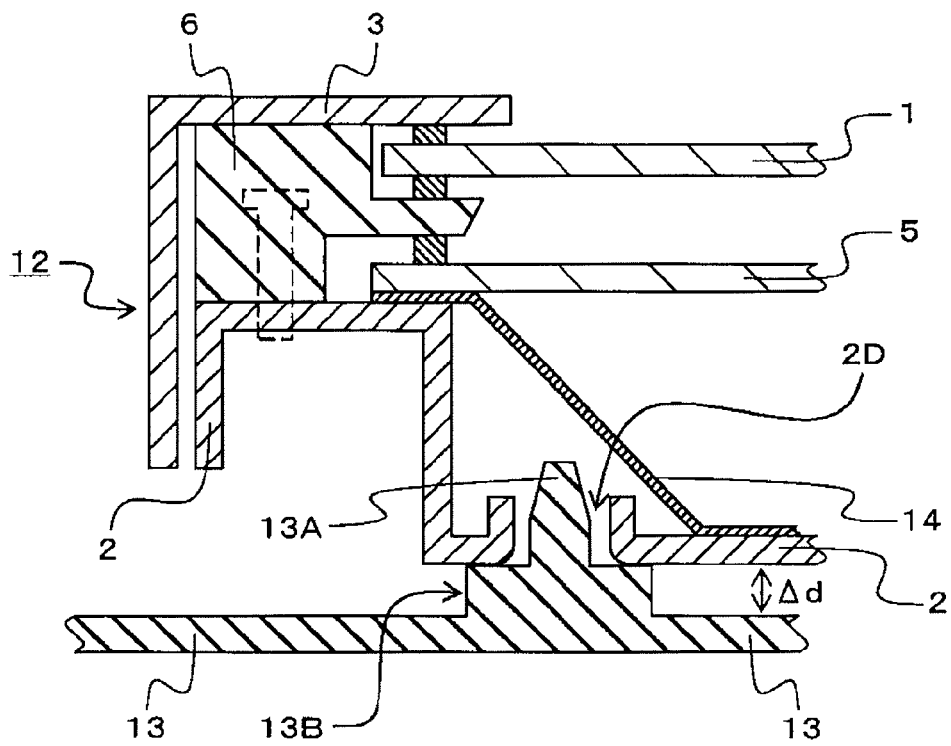
FIG. 22 is a schematic sectional view taken along with the lines E-E' in FIG. 21.
Figure 23:
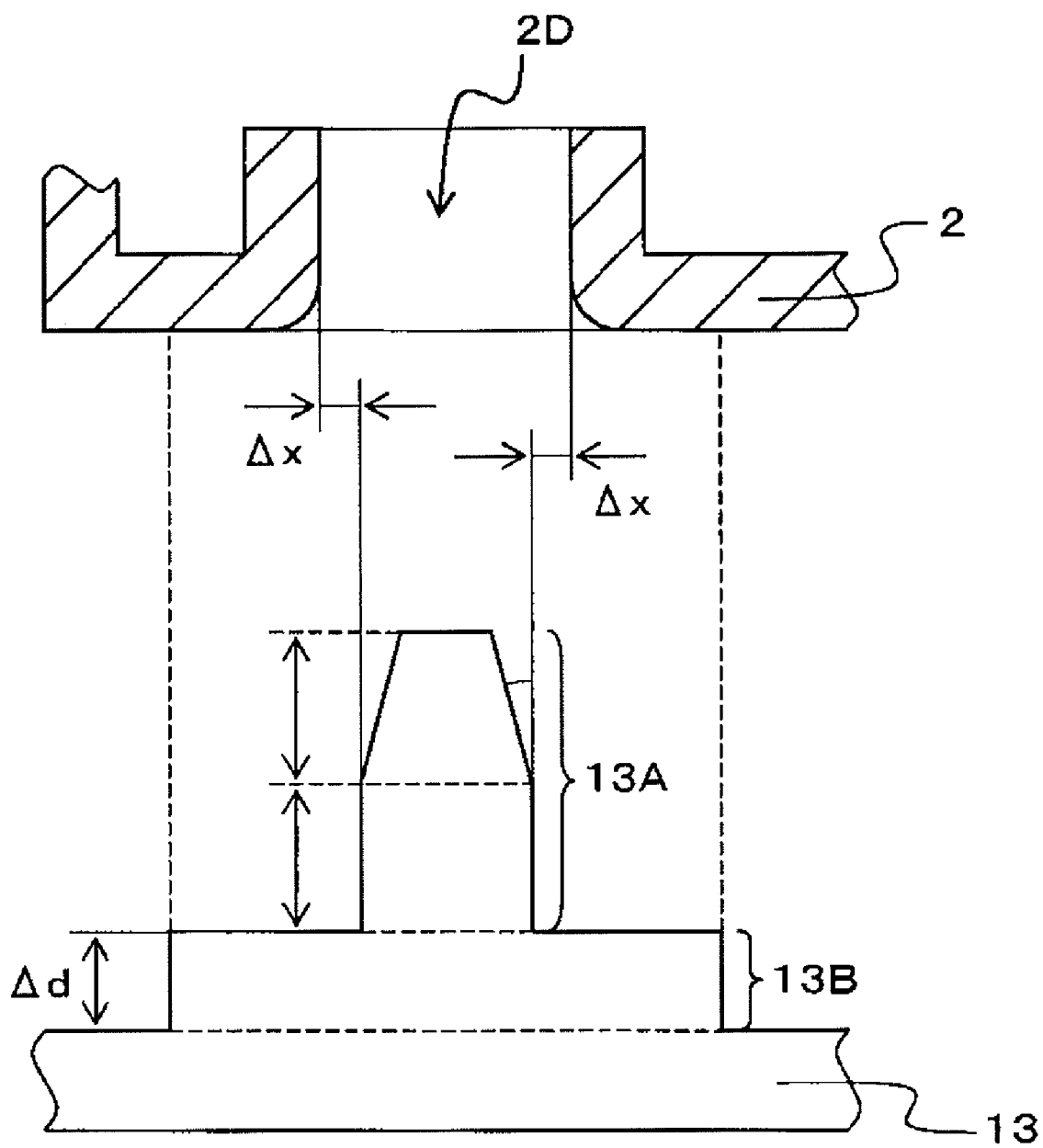
FIG. 23 is a schematic diagram illustrating a specific example of the positioning section between the liquid crystal display module and the cabinet.

FIGS. 21 to 23 are schematic diagrams illustrating a schematic configuration of a liquid crystal display device according to Embodiment 3 of the present invention.

FIG. 21 is a schematic perspective view illustrating a schematic configuration of a liquid crystal display module and a cabinet arranged in the rear of the module, FIG. 22 is a schematic sectional view taken along with the lines E-E' in FIG. 21, and FIG. 23 is a schematic diagram illustrating a specific example of the positioning section between the liquid crystal display module and the cabinet.

Embodiment 3 relates to the positioning when a liquid crystal display device (liquid crystal display module) having the configuration shown in FIGS. 1 to 3 is housed in a cabinet. The cabinet herein includes, for example, a first cabinet member and a second cabinet member. The first cabinet member is arranged in the rear of the liquid crystal display module, and the second cabinet member is arranged in front of the liquid crystal display module when viewed from a viewer. Components such as the liquid crystal display module 12 are housed in the first cabinet member 13 having a substantially box-like shape (FIG. 21). The second cabinet member (not shown) is then overlaid and fixed with the first cabinet member 13 typically by screwing. Thus, a so-called liquid crystal display device such as a television set is prepared.

With reference typically to FIGS. 21 and 23, the liquid crystal display device according to Embodiment 3 has positioning projections 13A at the bottom of the first cabinet member 13 in a region facing the liquid crystal display module 12 (lower frame 2). The lower frame 2 has positioning openings 2D, into which the positioning projections 13A of the first cabinet member 13 are inserted.

The openings 2D of the lower frame 2 are arranged in a region where a reflector 14 bends and extends toward a liquid crystal display panel 1. The reflector 14 is arranged between the lower frame 2 and liquid crystal display panel 1 (light-diffuser 5). The openings 2D of the lower frame 2 are formed, for example, by punching the lower frame 2 with a die, and bending the periphery of the opening edge toward the liquid crystal display panel 1. The openings 2D of the lower frame 2 are so bent as to have curbed surfaces into which the positioning projections 13A of the first cabinet member 13 are inserted (FIGS. 22 and 23).

The positioning projections 13A of the first cabinet member 13 are each provided with a mount 13B at the bottom thereof. The mount 13B has a height of $\Delta d$, and an area (planar area) larger than the opening area of the opening 2D of the lower frame 2. The mount 13B ensures a clearance $\Delta d$ between the first cabinet member 13 and the lower frame 2 when the liquid crystal display module 12 is placed on the first cabinet member 13. The clearance $\Delta d$ between the first cabinet member 13 and the lower frame 2 (liquid crystal display module 12) is adjusted by changing the height of the mount 13B so as to prevent contact between the first cabinet member and a TCON substrate to be mounted to the lower frame 2.

The projections 13A of the first cabinet member are chamfered at their tips so as to be inserted into the openings 2D of the lower frame easily. The chamfering angle of the tips is set, for example, at about 15 degrees. The ratio in height of a chamfered portion to a non-chamfered portion in the projections 13A of the first cabinet member is set, for example, about 1:1.

The positioning openings 2D of the lower frame 2 may be set to have a diameter after bending the opening edges thereof larger than the diameter of projections 13A of the first cabinet member 13. The clearance $\Delta x$ between the openings 2D of the lower frame and the projections 13A of the first cabinet member may be set, for example, at about 0.1 mm.

By arranging positioning projections 13A and positioning openings 2D having these configurations, the liquid crystal display module 12 can be easily mounted to a proper position on the first cabinet member 13 as shown in FIG. 22, even if misregistration occurs. This is because the projections 13A of the first cabinet member 13 slide along with the curbed surfaces of the openings 2D of the lower frame 2 upon misregistration.

When a liquid crystal display module 12 is placed on a first cabinet member 13 according to a known positioning configuration, positioning projections 13A arranged in the first cabinet member 13 are hidden by the liquid crystal display module 12. Accordingly, positioning is generally carried out depending typically on markers arranged in a region that is not hidden by the liquid crystal display module 12, and this deteriorates the workability in positioning.

In contrast, in a liquid crystal display device having the configuration as illustrated in Embodiment 3, the liquid crystal display module 12 can be arranged at a proper position as long as it is placed in the vicinity of the proper position. Accordingly, the positioning of the liquid crystal display device can be carried out with good workability, and the liquid crystal display device can be assembled with higher working efficiency.

As is described above, according to a liquid crystal display device of Embodiment 3, positioning between the first cabinet member 13 and liquid crystal display module 12 can be carried out easily with higher precision. Consequently, imperfect mounting due to misregistration can be reduced, and the productivity of the display device can be improved not only in manual assembly but also in automatic assembly using an assembly machine.

Figure 24:
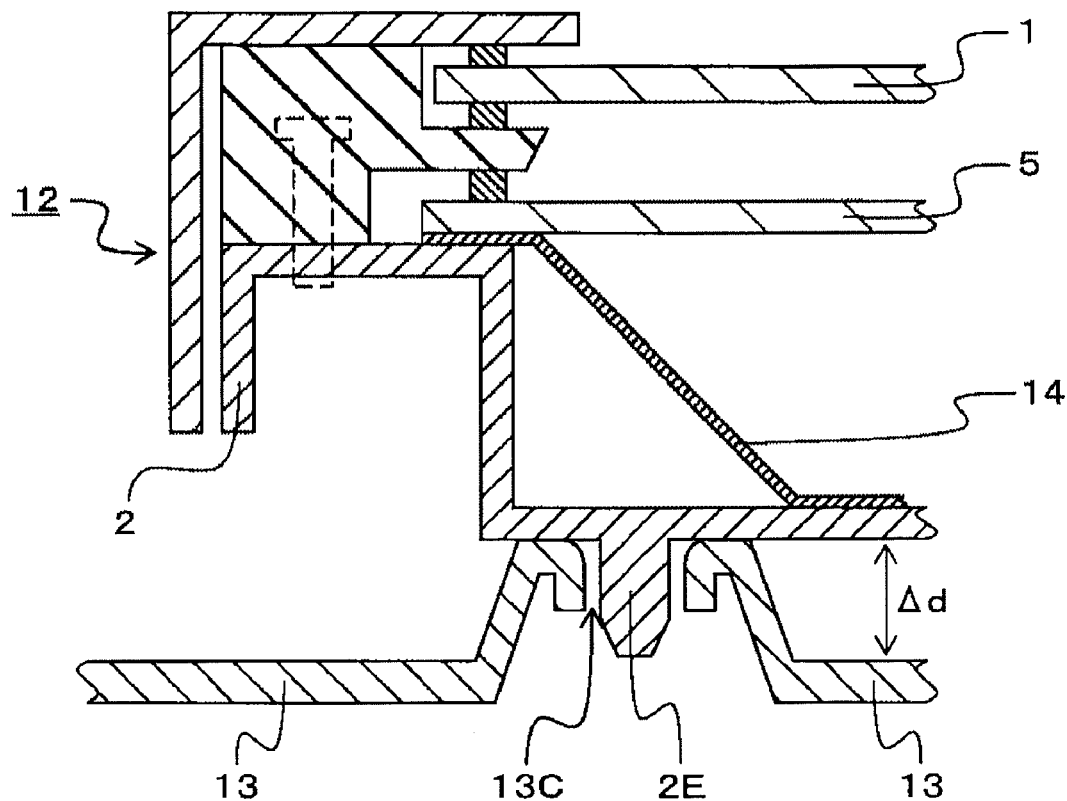
FIG. 24 is a schematic sectional view illustrating a modified embodiment of the liquid crystal display device according to Embodiment 3.
Figure 25:
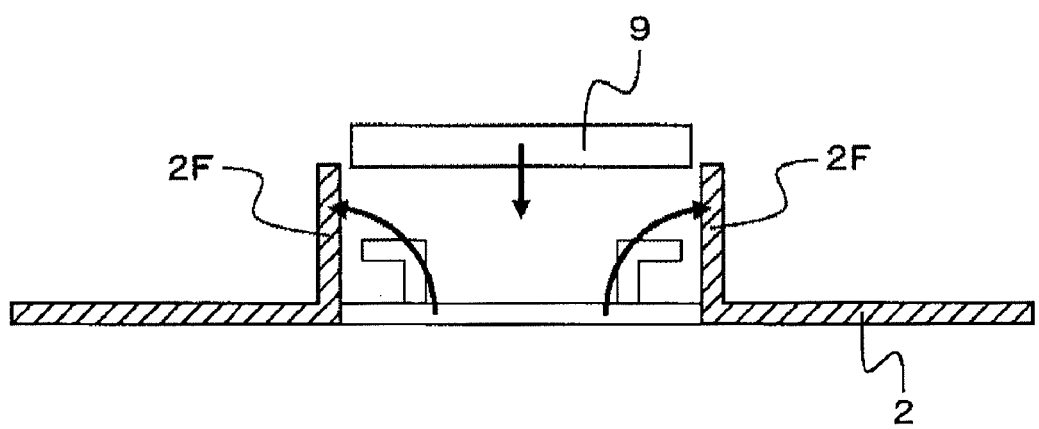
FIG. 25 is a schematic sectional view illustrating the schematic configuration of a region in the lower frame to which a TCON substrate is to be mounted in the known liquid crystal display device.
Figure 26:
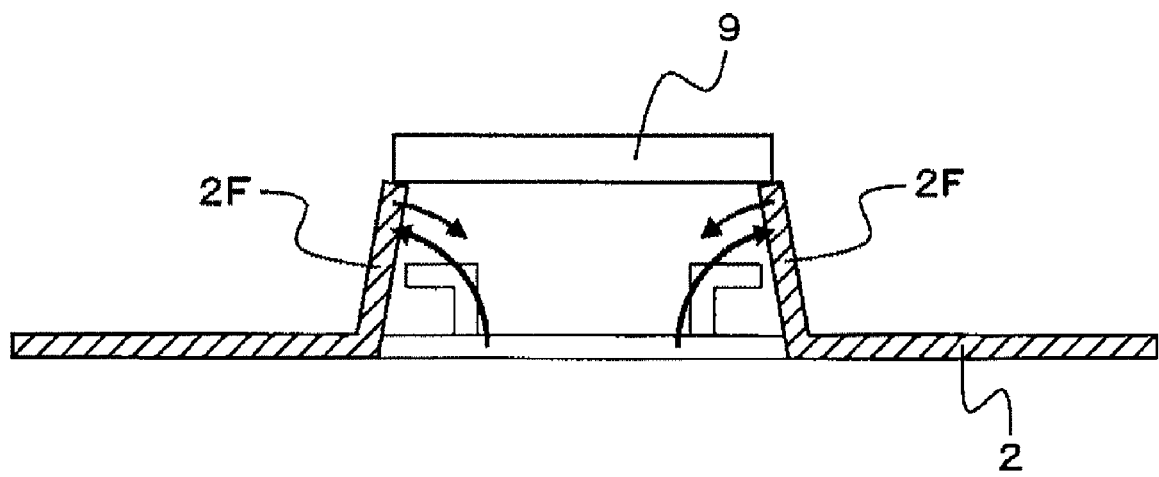
FIG. 26 is a schematic diagram illustrating one of problems in the configuration in FIG. 25.

FIG. 24 is a schematic sectional view illustrating a modified embodiment of a liquid crystal display device according to Embodiment 3 and is a diagram corresponding to the cross section taken along with the lines E-E' in FIG. 21.

According to the liquid crystal display device shown in FIGS. 21 to 23, positioning upon placement of the liquid crystal display module 12 onto the first cabinet member 13 is carried out easily by arranging the projections 13A and the mounts 13B in the first cabinet member 13, and arranging positioning openings 2D in the lower frame 2. However, when the liquid crystal display module 12 is placed on the first cabinet member 13 as in Embodiment 3, the configuration of the liquid crystal display device is not limited thereto. For example, it is also acceptable to arrange positioning projections 2E in the lower frame 2, and positioning openings 13C in the first cabinet member 13 (FIG. 24).

The positioning projections 2E of the lower frame 2 may be formed, for example, by drawing with a die.

The positioning openings 13C of the first cabinet member 13 may be formed, for example, in the same manner as in the positioning opening 301A of the upper frame 301 illustrated in Embodiment 2. In this case, the clearance Δd between the first cabinet member 13 and the lower frame 2 (liquid crystal display module 12) may be adjusted, for example, by changing the protruded height of the positioning openings 13C of the first cabinet member 13 toward the lower frame 2, so as to prevent the contact between the first cabinet member 13 and, for example, the TCON substrate 9 mounted to the lower frame 2.

In Embodiment 3, attention is focused on the positioning section between the first cabinet member 13 and the lower frame 2 (liquid crystal display module 12), and the configuration thereof alone has been described. However, the configuration according to Embodiment 3 can naturally be combined typically with the configuration of the positioning section between the TCON substrate 9 and the lower frame 2 as illustrated in Embodiment 1 and/or the configuration of the positioning section between the supporting member 6 and the upper frame 3 as illustrated in Embodiment 2.

While the present invention has been illustrated with reference to some embodiments as above, it should be understood by those skilled in the art that various alternations and modifications are possible within ranges not departing from the scope and spirit of the present invention.

For example, while Embodiments 1 to 3 have been illustrated by taking a liquid crystal display device (module) having the configuration shown in FIGS. 1 to 3 as an example, it should be noted such embodiments of the present invention can also be applied to display devices having other configurations. Specifically, the configuration illustrated in Embodiment 1 can be applied to any display devices as long as a printed circuit board, for example, is mounted to a flat plane typically at the bottom of a lower frame, and configurations of other portions and components of display devices are not limited. The configuration illustrated in Embodiment 2 can be applied to any display devices, as long as an outer periphery of a liquid crystal display panel is held between a supporting member and an upper frame, and configurations of other portions and components of display devices are not limited. The configuration illustrated in Embodiment 3 can be applied to any liquid crystal display devices, as long as they include a liquid crystal display module with a lower frame, and a cabinet housing the liquid crystal display module, and configurations of other portions and components of display devices are not limited.

While Embodiments 1 to 3 have been illustrated by taking a liquid crystal display device (module) having a liquid crystal display panel as an example, it should be noted embodiments according to the present invention can be applied to any display devices (modules) having similar configurations. For example, embodiments according to the present invention can also be applied to display devices using, instead of a liquid crystal display panel, a plasma display panel (PDP), and those using a self-luminous display panel with organic electroluminescence (organic EL).

What is claimed is:

1. A display device comprising:
a display panel;
a lower frame arranged in the rear of the display panel when viewed from a viewer; and
at least one printed circuit board arranged on or above a flat plane of the lower frame,
wherein the lower frame carries plural positioning projections, the positioning projections located outside of a region where the printed circuit board is arranged at plural positions facing each other with the interposition of the region, and the positioning projections arising from the flat plane of the lower frame toward the printed circuit board, and
distal portions of the positioning projections protrude from, and bend away from the printed circuit board arranged on or above the lower frame.

2. The display device according to claim 1,
wherein the lower frame has protrusions for fixing the printed circuit board, the protrusions located inside of the region where the printed circuit board is arranged, and bending so as to support and fix the printed circuit board.

3. The display device according to claim 1,
wherein the printed circuit board has positioning grooves at least in the vicinities of center parts of parallel two sides, the positioning grooves being concave toward the center of the printed circuit board, and
the positioning projections of the lower frame engage with the positioning grooves of the printed circuit board so as to support and fix the printed circuit board.

4. The display device according to claim 1,
wherein the printed circuit board has a substantially quadrilateral planar shape, and
the positioning projections of the lower frame are arranged at positions facing the four sides of the printed circuit board, respectively.

5. The display device according to claim 1,
wherein the printed circuit board is arranged in the rear of the lower frame when viewed from a viewer.

6. The display device according to claim 1,
wherein the display panel is a liquid crystal display panel comprising:
a pair of substrates; and
a liquid crystal material encapsulated between the pair of substrates.

7. A display device comprising:
a display panel;
a supporting member arranged on an outer periphery of the display panel when viewed from a viewer; and
an upper frame arranged in front of the display panel when viewed from the viewer,
the supporting member and the upper frame supporting the display panel by holding the outer periphery of the display panel between them,
wherein the supporting member carries at least one positioning projection arranged on a plane facing the upper frame and protruding toward the upper frame,
the upper frame has at least one positioning opening corresponding to the at least one positioning projection of the supporting member, and
the opening edge of the upper frame around the positioning opening has an inner periphery and an outer periphery, the outer periphery extending toward the supporting member, and the inner periphery located in the vicinity of the opening edge and extending away from the supporting member.

8. The display device according to claim 7,
wherein a surface of the inner periphery facing the positioning projection of the supporting member is curved.

9. The display device according to claim 7, wherein the at least one positioning opening of the upper frame is located in the vicinity of the bottom of the at least one positioning projection of the supporting member.

10. The display device according to claim 7, wherein the outer periphery of the opening edge extends toward the supporting member longer than the inner periphery of the opening edge extends away from the supporting member.

11. The display device according to claim 7, wherein the display panel is a liquid crystal display panel comprising:

a pair of substrates; and a liquid crystal material encapsulated between the pair of substrates.

12. A display device comprising:

a display module including a display panel and a lower frame arranged in the rear of the display panel when viewed from a viewer; and a cabinet housing the display module, wherein the cabinet has plural positioning projections, the positioning projections located in the rear of the lower frame when viewed from the viewer, arranged on a plane facing the lower frame, and protruding toward the lower frame, wherein the lower frame has positioning openings corresponding to the positioning projections of the cabinet, and the vicinities of opening edges of the peripheries around the positioning openings of the lower frame bend and extend away from a plane facing the cabinet, and surfaces of the bending vicinities facing the positioning openings of the cabinet are curved.

13. The display device according to claim 12, wherein the bottoms of the positioning projections of the cabinet have planar areas larger than the opening areas of the corresponding positioning openings of the lower frame.

14. A display device comprising:

a display module including a display panel and a lower frame arranged in the rear of the display panel when viewed from a viewer; and a cabinet housing the display module, wherein the cabinet is located in the rear of the lower frame when viewed from the viewer and has at least one positioning opening in a plane facing the lower frame, the lower frame carries at least one positioning projection corresponding to the at least one positioning opening of the cabinet, and the opening edge of the cabinet around the positioning opening has an inner periphery and an outer periphery, the outer periphery bending and extending toward the lower frame, and the inner periphery located in the vicinity of the opening edge and bending and extending away from the lower frame.

15. The display device according to claim 14, wherein a surface of the inner periphery facing the positioning projection of the lower frame is curved.

16. The display device according to claim 14, wherein the at least one positioning opening of the cabinet is located in the vicinity of the bottom of the at least one positioning projection of the lower frame.

17. The display device according to claim 14, wherein the outer periphery of the positioning opening of the cabinet extends toward the lower frame longer than the inner periphery of the opening edge extends away from the lower frame.

18. The display device according to claim 12, wherein the display panel is a liquid crystal display panel comprising:

a pair of substrates; and a liquid crystal material encapsulated between the pair of substrates.

19. The display device according to claim 14, wherein the display panel is a liquid crystal display panel comprising:

a pair of substrates; and a liquid crystal material encapsulated between the pair of substrates.

* * * * *